(12) United States Patent
Wang et al.

(10) Patent No.: US 9,089,881 B2
(45) Date of Patent: Jul. 28, 2015

(54) METHOD AND APPARATUS FOR CLEANING SUBSTRATE

(75) Inventors: Xinming Wang, Tokyo (JP); Fumitoshi Oikawa, Tokyo (JP); Haruko Ono, Tokyo (JP); Teruaki Hombo, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 532 days.

(21) Appl. No.: 13/037,487

(22) Filed: Mar. 1, 2011

(65) Prior Publication Data

US 2011/0209727 A1 Sep. 1, 2011

(30) Foreign Application Priority Data

Mar. 1, 2010 (JP) ................................ 2010-043784

(51) Int. Cl.
  *B08B 1/04* (2006.01)
  *H01L 21/67* (2006.01)
(52) U.S. Cl.
  CPC ............ *B08B 1/04* (2013.01); *H01L 21/67046* (2013.01)
(58) Field of Classification Search
  CPC ........................................................ B08B 1/04
  USPC ............................ 15/21.1, 77, 88.3, 88.4, 102
  See application file for complete search history.

(56) References Cited

U.S. PATENT DOCUMENTS

| | | | | |
|---|---|---|---|---|
| 3,989,357 A | * | 11/1976 | Kalt | 359/231 |
| 4,795,510 A | * | 1/1989 | Wittrock et al. | 156/64 |
| 5,285,548 A | * | 2/1994 | Moll | 15/3.2 |
| 5,576,135 A | * | 11/1996 | Nishikawa | 430/124.12 |
| 5,651,160 A | * | 7/1997 | Yonemizu et al. | 15/302 |
| 6,003,185 A | * | 12/1999 | Saenz et al. | 15/77 |
| 6,052,855 A | * | 4/2000 | Terui | 15/77 |
| 6,059,888 A | * | 5/2000 | Hillman | 134/6 |
| 6,106,635 A | * | 8/2000 | Hamada et al. | 134/33 |
| 6,112,355 A | * | 9/2000 | Tsuchida et al. | 15/77 |
| 6,150,066 A | * | 11/2000 | Kurotori et al. | 430/97 |
| 6,427,566 B1 | * | 8/2002 | Jones et al. | 82/101 |
| RE38,228 E | * | 8/2003 | Hirose et al. | 451/56 |
| 6,616,516 B1 | * | 9/2003 | Ravkin et al. | 451/194 |
| 6,837,777 B2 | * | 1/2005 | Ziemins et al. | 451/44 |
| 6,851,152 B2 | * | 2/2005 | Sotozaki et al. | 15/88.3 |

(Continued)

FOREIGN PATENT DOCUMENTS

| | | | | |
|---|---|---|---|---|
| JP | 07263389 A | * | 10/1995 | H01L 21/304 |
| JP | 10335283 A | * | 12/1998 | H01L 21/304 |

(Continued)

*Primary Examiner* — Monica Carter
*Assistant Examiner* — Michael Jennings
(74) *Attorney, Agent, or Firm* — Wenderoth, Lind & Ponack, L.L.P.

(57) ABSTRACT

A substrate is cleaned by performing a scrubbing process on a surface to be cleaned of the rotating substrate with a roll-shaped cleaning member while holding an outer circumferential surface of the roll-shaped cleaning member in contact with the surface to be cleaned of the substrate across a predetermined contact width. During at least a part of the scrubbing process, the roll-shaped cleaning member is placed at an offset cleaning position where the central axis of the roll-shaped cleaning member is spaced from the central axis of the substrate by a distance which is 0.14 to 0.5 times the contact width. The surface to be cleaned of the substrate is scrubbed with more uniform cleaning intensity while taking into account the cleaning intensity at each position (area) along the radial direction of the surface to be cleaned of the substrate.

9 Claims, 13 Drawing Sheets

(56) References Cited

U.S. PATENT DOCUMENTS

| | | | |
|---|---|---|---|
| 7,077,731 B1* | 7/2006 | Zhang | 451/194 |
| 7,087,117 B2* | 8/2006 | Katsuoka et al. | 118/429 |
| 7,155,767 B2* | 1/2007 | Kouno et al. | 15/88.2 |
| 7,185,384 B2 | 3/2007 | Sun et al. | |
| 7,220,323 B2* | 5/2007 | Hashi et al. | 134/6 |
| 8,226,771 B2* | 7/2012 | Oikawa et al. | 134/1.3 |
| 8,332,984 B2* | 12/2012 | Yeh et al. | 15/97.1 |
| 8,356,376 B2* | 1/2013 | Mouri et al. | 15/77 |
| 2002/0029431 A1* | 3/2002 | Oikawa et al. | 15/77 |
| 2007/0006405 A1* | 1/2007 | Feng et al. | 15/77 |
| 2007/0084004 A1* | 4/2007 | Shizawa et al. | 15/77 |
| 2007/0226924 A1* | 10/2007 | Hiraoka et al. | 15/102 |
| 2008/0011325 A1* | 1/2008 | Olgado et al. | 134/9 |
| 2008/0190451 A1* | 8/2008 | Goto | 134/6 |
| 2010/0065191 A1* | 3/2010 | Hatano et al. | 156/157 |

FOREIGN PATENT DOCUMENTS

| | | | | |
|---|---|---|---|---|
| JP | 11026408 A * | 1/1999 | | H01L 21/304 |
| JP | 2887095 | 2/1999 | | |
| JP | 2000-77379 | 3/2000 | | |
| JP | 2001237209 A * | 8/2001 | | H01L 21/304 |
| JP | 2001-358110 | 12/2001 | | |
| JP | 3343503 | 8/2002 | | |
| JP | 2004-174679 | 6/2004 | | |
| JP | 3854085 | 9/2006 | | |
| JP | 4023907 | 10/2007 | | |

* cited by examiner

METHOD AND APPARATUS FOR CLEANING SUBSTRATE

BACKGROUND OF THE INVENTION

1. Field of the Invention

The present invention relates to a method and an apparatus for cleaning a substrate by scrubbing a surface to be cleaned of the substrate while the substrate is in rotation with a roll-shaped cleaning member, such as a roll brush, a roll sponge, or the like, which is being held in contact with the surface to be cleaned of the substrate.

2. Description of the Related Art

As semiconductor devices are finding themselves integrated to increasingly higher levels, there is a demand in the art for the development of a cleaning technology for highly cleaning an entire surface (front surface and/or back surface) of substrates in order to achieve a high yield of product substrates. For example, CMP (Chemical Mechanical Polishing) processes, which are performed to planarize insulating films, produce STIs (Shallow Trench Isolations), form tungsten plugs, and form multilayer copper interconnects, generally employ a contact-type scrubbing process for effectively removing remaining residue from polished substrate surfaces. When substrates having devices of smaller dimensions are polished, metal interconnects that are exposed by the polishing process may possibly be chemically or electrochemically corroded under etching forces of chemicals used and mechanical forces. Such metal interconnect corrosions are considered to adversely affect the reliability of the devices significantly. Accordingly, it has been desired in the art to develop a suitable cleaning technology which is capable of effectively removing remaining residue from polished substrate surfaces while minimizing any adverse effects to devices.

Generally, CMP apparatuses are configured to operate by scrubbing a surface of a substrate, such as a semiconductor wafer or the like, with a roll-shaped cleaning member, such as a roll brush, a roll sponge, or the like, while the roll-shaped cleaning member and the substrate are being rotated about their own axes and also while the roll-shaped cleaning member is being held in contact with the surface of the substrate under a predetermined pressure. It is customary in the scrubbing process to place the roll-shaped cleaning member in a position where the central axis of the roll-shaped cleaning member and the central axis of the substrate, i.e., the central axis, about which the substrate rotates, cross each other perpendicularly (see Japanese patent No. 4023907, patent documents 1, and Japanese patent No. 3854085, patent document 2).

When the surface (surface to be cleaned) of the substrate is scrubbed by the roll-shaped cleaning member that is placed in the above position, however, the roll-shaped cleaning member contacts the surface of the substrate with a higher contact density in a central area of the substrate and with a lower contact density in a peripheral area of the substrate. As a result, the cleaning intensity over the entire surface of the substrate suffers irregularities due to the different contact densities, making it difficult for the scrubbing process to meet desired cleaning requirements. The failure to meet the desired cleaning requirements has a detrimental effect on efforts to prevent, e.g., local interconnect corrosions on the surface of the substrate.

FIGS. 1 and 2 schematically show a conventional substrate cleaning apparatus which uses roll brushes as roll-shaped cleaning members. As shown in FIGS. 1 and 2, this substrate cleaning apparatus includes an upper roll brush (roll-shaped cleaning member) 10 disposed in contact with a front surface (upper surface) of a substrate W for scrubbing the front surface of the substrate W, and an upper cleaning liquid supply nozzle 12 for supplying a cleaning liquid to the front surface of the substrate W. The upper roll brush 10 and the upper cleaning liquid supply nozzle 12 are positioned upwardly of the substrate W. This substrate cleaning apparatus also includes a lower roll brush (roll-shaped cleaning member) 14 disposed in contact with a back surface (lower surface) of the substrate W for scrubbing the back surface of the substrate W, and a lower cleaning liquid supply nozzle 16 for supplying a cleaning liquid to the back surface of the substrate W. The lower roll brush 14 and the lower cleaning liquid supply nozzle 16 are positioned downwardly of the substrate W.

As shown in detail in FIG. 3, each of the upper roll brush 10 and the lower roll brush 14 comprises a roll brush 18 having a number of cylindrical nodules (protrusions) 18a on its outer circumferential surface. The nodules 18a have projecting distal end faces held in contact with the surface to be cleaned of the substrate W across a contact width Li.

The upper roll brush 10 is placed in a position where the central axis $O_1$ thereof and the central axis $O_2$ of the substrate W, i.e., the central axis, about which the substrate W rotates, cross each other perpendicularly. While the cleaning liquid is being supplied from the upper cleaning liquid supply nozzle 12 onto the front surface of the substrate W, the upper roll brush 10 is pressed against the front surface of the substrate W under a predetermined pressure. At the same time, the upper roll brush 10 is rotated about the central axis $O_1$ and the substrate W is rotated about the central axis $O_2$, thereby scrubbing the front surface of the substrate W.

Similarly, the lower roll brush 14 is placed in a position where the central axis $O_3$ thereof and the central axis $O_2$ of the substrate W cross each other perpendicularly. While the cleaning liquid is being supplied from the lower cleaning liquid supply nozzle 16 onto the back surface of the substrate W, the lower roll brush 14 is pressed against the back surface of the substrate W under a predetermined pressure. At the same time, the lower roll brush 14 is rotated about the central axis $O_3$ and the substrate W is rotated about the central axis $O_2$, thereby scrubbing the back surface of the substrate W.

Thus, the front and back surfaces of the substrate W are cleaned under identical conditions. Therefore, the process of cleaning the front surface of the substrate W with the upper roll brush 10 in the form of the roll brush 18 shown in FIG. 3 will be described below.

When the nodules 18a of the roll brush 18 pass over each point on the front surface of the substrate W, the distance that the front surface of the substrate W is rubbed by the nodules 18a per unit time is calculated. It is assumed that an average value of the calculated distances at positions at a radius r along a circumferential direction on the front surface of the substrate W is referred to as a cleaning intensity $R_c$ (m/s). It is believed that the uniformity with which the entire front surface of the substrate W is cleaned can be evaluated by the cleaning intensity $R_c$ (m/s). The cleaning intensity $R_c$ (m/s) at the radius r on the front surface of the substrate W is expressed by the following equation:

$$R_c = \frac{nLi}{R_r} V_{rw}$$

where n represents the number of nodules 18a formed on the roll brush 18 along the circumferential direction of the roll brush 18, Li the contact width across which each nodule 18a contacts the front surface of the substrate W, i.e., the diameter of the nodule 18a, as shown in FIG. 3, $R_r$ the radius of the roll brush 18, and $V_{rw}$ the average value of relative speeds between the distance end face of the nodule 18a and the front surface of the substrate W along the circumferential direction of the substrate W. The average value $V_{rw}$ is expressed by the following equation:

$$\overline{V}_{rw} = \frac{1}{2\pi r} \int_0^{2\pi} |\overline{V}_{rw(\theta)}| r\, d\theta$$

where $V_{rw(\theta)}$ represents each position along the circumferential direction. Each position $V_{rw(\theta)}$ along the circumferential direction is determined by the following equation:

$$\overline{V}_{rw(\theta)} = \begin{cases} 0 & \text{Noncontact area between nodule and substrate} \\ \overline{V}_r - \overline{V}_w & \text{Contact area between nodule and substrate} \end{cases}$$

where $V_r$ represents the vector of the speed of the end face of the nodule 18a, and $V_w$ the vector of the speed of the front surface (surface to be cleaned) of the substrate W.

FIG. 4 shows the relationship between the cleaning intensity $R_c$ and the radius r of the substrate W when the front surface of the substrate W is cleaned by the roll brush 18 at the time the roll brush 18 as the upper roll brush 10 rotates at a constant rotational speed of 100 rpm and the substrate W rotates at different rotational speeds of 50 rpm, 100 rpm, and 200 rpm. It can be seen from FIG. 4 that under any cleaning conditions the cleaning intensity $R_c$ has a peak in an area near the center of the substrate W. The peak has a value that is 6 to 30 times a flat value of the cleaning intensity $R_c$, i.e., a substantially constant value of the cleaning intensity $R_c$. It can also be seen that the area exhibiting the peak of the cleaning intensity $R_c$ lies within a radius of 25 mm on the front surface of the substrate W. This suggests that if the front surface of the substrate W is cleaned to achieve the sufficient flat value of the cleaning intensity $R_c$, then the area within the radius of 25 mm on the front surface of the substrate W is intensively cleaned and interconnect corrosions are developed.

FIG. 5 shows the calculated relationship between the cleaning intensity $R_c$ and the radius r of the substrate W when the substrate W is cleaned by roll brushes 18 with nodules 18a having diameters (contact widths: Li) of 3 mm, 6 mm, 10 mm, and 15 mm. It can be seen from FIG. 5 that under any cleaning conditions the area where the substrate W is intensively cleaned is present near the center of the substrate W and as the contact width Li becomes smaller, the peak of the cleaning intensity $R_c$ also becomes smaller in height and width. Table 1, below, shows the relationship between the radial position r of the substrate W and the contact width Li when the cleaning intensity $R_c$ is 20% higher than the flat value thereof. It can be understood from Table 1 that in a practical range of contact widths, i.e., from 3 mm to 10 mm, the ratio (r/Li) of the radial position r of the substrate W to the contact width Li at the time the cleaning intensity $R_c$ is 20% higher than the flat value thereof is about 8 or smaller.

TABLE 1

| Contact width Li (mm) | 3 | 6 | 10 | 15 |
|---|---|---|---|---|
| Radius (mm) at 120% of flat value | 25 | 25 | 25 | 30 |

In order to prevent the entire front surface of the substrate from being cleaned irregularly by the roll-shaped cleaning member, which may be a roll brush, a roll sponge, or the like, it has been proposed to improve the shape of a roll brush by, for example, providing protrusions or nodules having a density or area which differs in the longitudinal direction of the roll brush on the outer circumferential surface thereof (see Japanese laid-open patent publication No. 2001-358110, patent document 3) or changing the outside diameter of a roll brush (see U.S. Pat. No. 7,185,384, patent document 4). However, since the roll brush is mounted on a polishing apparatus in a fixed positional relationship to the substrate according to any of the above proposals, it is conceivable that the distribution of cleaning intensities over the surface to be cleaned of the substrate cannot be adjusted as desired depending on the conditions under which the roll brush and the substrate rotate about their own axes.

There has been proposed a cleaning apparatus wherein a substrate moves back and forth in a horizontal plane parallel to a roll-shaped cleaning member as the substrate rotates about its own central axis (see Japanese laid-open patent publication No. 2000-77379, patent document 5). There has also been proposed a cleaning apparatus having an upper roll brush and a lower roll brush disposed such that axes of the upper roll brush and the lower roll brush extend parallel to each other and are biased perpendicularly to the central axis about which a substrate rotates (see Japanese patent No. 2887095, patent document 6).

The cleaning apparatuses disclosed in Patent documents 1 through 6, however, are not configured to take into account the cleaning intensity at each position (area) along the radial direction of the surface to be cleaned of the substrate in view of the contact width and contact frequency with which the substrate contacts the nodules. Consequently, even though the front surface (surface to be cleaned) of the substrate is cleaned by the roll-shaped cleaning member while the surface to be cleaned of the substrate is moving back and forth parallel to the roll-shaped cleaning member, or even though the upper roll brush and the lower roll brush are disposed such that axes of the upper roll brush and the lower roll brush extend parallel to each other and are biased perpendicularly to the central axis about which the substrate rotates, it is considered difficult to scrub the entire surface to be cleaned of the substrate with more uniform cleaning intensity.

SUMMARY OF THE INVENTION

The present invention has been made in view of the above situation. It is therefore an object of the present invention to provide a method and an apparatus for cleaning a substrate by scrubbing an entire surface to be cleaned of the substrate with more uniform cleaning intensity while taking into account the cleaning intensity at each position (area) along the radial direction of the surface to be cleaned of the substrate.

In order to achieve the above object, the present invention provides a method of cleaning a substrate comprising: performing a scrubbing process on a surface to be cleaned of the rotating substrate with a roll-shaped cleaning member while holding an outer circumferential surface of the roll-shaped cleaning member in contact with the surface to be cleaned of the substrate across a predetermined contact width; and during at least a part of the scrubbing process, placing the roll-shaped cleaning member at an offset cleaning position where the central axis of the roll-shaped cleaning member is spaced from the central axis of the substrate by a distance which is 0.14 to 0.5 times the contact width.

As described above, during at least a part of the scrubbing process, the roll-shaped cleaning member is placed at the offset cleaning position. Therefore, a central area of the surface to be cleaned of the substrate is prevented from being cleaned intensively. In the offset cleaning position, the central axis of the roll-shaped cleaning member is spaced from the central axis of the substrate by a distance which is 0.14 to 0.5 times the contact width. Consequently, the central area of the surface to be cleaned of the substrate is prevented from being uncleaned.

The present invention also provides a method of cleaning a substrate comprising: performing a scrubbing process on a surface to be cleaned of the rotating substrate with a roll-shaped cleaning member while holding an outer circumferential surface of the roll-shaped cleaning member in contact with the surface to be cleaned of the substrate across a predetermined; and during the scrubbing process, reciprocally moving the roll-shaped cleaning member parallel to the surface to be cleaned of the substrate in a range of movement which is set within 16 times the contact width, near a position where the central axis of the roll-shaped cleaning member and the central axis of the substrate cross each other.

As described above, during the scrubbing process, the roll-shaped cleaning member is reciprocally moved parallel to the surface to be cleaned of the substrate in a range of movement which is set within 16 times the contact width, near a position where the central axis of the roll-shaped cleaning member and the central axis of the substrate cross each other. Therefore, it is possible to prevent the cleaning intensity from becoming 20% or more higher than a flat value thereof in each area of the surface to be cleaned of the substrate.

In a preferred aspect of the present invention, the roll-shaped cleaning member is controlled to move at a speed which is highest at the position where the central axis of the roll-shaped cleaning member and the central axis of the substrate cross each other.

Accordingly, the roll-shaped cleaning member passes quickly through the position where the central axis of the roll-shaped cleaning member and the central axis of the substrate cross each other and an area near that position, thereby cleaning the entire surface to be cleaned of the substrate more uniformly.

In a preferred aspect of the present invention, the roll-shaped cleaning member is controlled to move at a speed which is inversely proportional to the distance by which the roll-shaped cleaning member is spaced from the position where the central axis of the roll-shaped cleaning member and the central axis of the substrate cross each other, and which has a maximum moving speed and a minimum moving speed at a ratio ranging from 3 to 11.

Consequently, the cleaning intensity, which varies depending on the moving speed of the roll-shaped cleaning member, is made more uniform over the entire surface to be cleaned of the substrate.

The present invention also provides a method of cleaning a substrate comprising: performing a scrubbing process on a surface to be cleaned of the rotating substrate with a roll-shaped cleaning member while holding an outer circumferential surface of the roll-shaped cleaning member in contact with the surface to be cleaned of the substrate; and during the scrubbing process, dwelling the roll-shaped cleaning member in a plurality of cleaning positions for respective predetermined times, wherein at least one of the cleaning positions comprises an offset cleaning position where the central axis of the roll-shaped cleaning member is spaced from the central axis of the substrate.

By thus performing the scrubbing process while the roll-shaped cleaning member is dwelling in at least one offset cleaning position where the central axis of the roll-shaped cleaning member is spaced from the central axis of the substrate, the cleaning density is prevented from becoming intensive in the central area of the substrate.

In a preferred aspect of the present invention, the cleaning positions include a plurality of offset cleaning positions, and the time during which the roll-shaped cleaning member dwells in each of the offset cleaning positions is proportional to the distance between each of the offset cleaning positions and the central axis of the substrate.

This makes it possible to clean the entire surface to be cleaned of the substrate more uniformly.

In a preferred aspect of the present invention, the outer circumferential surface of the roll-shaped cleaning member has a plurality of nodules for contacting the surface to be cleaned of the substrate, the nodules being distributed so as to be progressively denser from the center toward outer ends of the roll-shaped cleaning member.

This makes it possible to prevent the cleaning intensity from being intensive in the central area of the substrate effectively by the roll-shaped cleaning member itself.

The present invention also provides an apparatus for cleaning a substrate comprising: a roll-shaped cleaning member for performing a scrubbing process on a surface to be cleaned of the rotating substrate while holding an outer circumferential surface of the roll-shaped cleaning member in contact with the surface to be cleaned of the substrate across a predetermined contact width; a moving mechanism for moving the roll-shaped cleaning member to an offset cleaning position where the central axis of the roll-shaped cleaning member is spaced from the central axis of the substrate by a distance which is 0.14 to 0.5 times the contact width, and stopping the roll-shaped cleaning member at the offset cleaning position in coaction with a stopper; and a stop position adjuster for positionally adjusting the stopper.

Therefore, the position where the roll-shaped cleaning member is stopped can be reached with good reproducibility because it is mechanically regulated by the stopper. The stopper can easily and quickly be adjusted in position by the stop position adjuster.

The present invention also provides an apparatus for cleaning a substrate comprising: a roll-shaped cleaning member for performing a scrubbing process on a surface to be cleaned of the rotating substrate while holding an outer circumferential surface of the roll-shaped cleaning member in contact with the surface to be cleaned of the substrate across a predetermined contact width; and a reciprocally moving mechanism for reciprocally moving the roll-shaped cleaning member parallel to the surface to be cleaned of the substrate in a range of movement which is set within 16 times the contact width, near a position where the central axis of the roll-shaped cleaning member and the central axis of the substrate cross each other.

In a preferred aspect of the present invention, the reciprocally moving mechanism includes a controller for controlling the moving speed of the roll-shaped cleaning member.

In a preferred aspect of the present invention, the roll-shaped cleaning member has an end angularly movably supported by a pivot shaft, and the reciprocally moving mechanism swings the roll-shaped cleaning member about the pivot shaft.

The roll-shaped cleaning member, which is swingable about the pivot shaft, makes the substrate cleaning apparatus simple in structure because it only needs a swinging mechanism on one end of the roll-shaped cleaning member. Furthermore, the pressing force applied to the free end of the roll-shaped cleaning member can be adjusted such that the cleaning intensity is higher at the outer circumferential area of the substrate than at the central area of the substrate.

The present invention also provides an apparatus for cleaning a substrate comprising: a roll-shaped cleaning member for performing a scrubbing process on a surface to be cleaned of the rotating substrate while holding an outer circumferential surface of the roll-shaped cleaning member in contact with the surface to be cleaned of the substrate across a predetermined contact width; and a reciprocally moving mechanism for reciprocally moving the roll-shaped cleaning member between a cleaning position where the central axis of the roll-shaped cleaning member and the central axis of the substrate cross each other and at least one offset cleaning position where the central axis of the roll-shaped cleaning member is spaced from the central axis of the substrate, and controlling the roll-shaped cleaning member to dwell in the cleaning position and the offset cleaning position during respective predetermined times.

In a preferred aspect of the present invention, the reciprocally moving mechanism includes a positionally adjustable stopper for positioning and stopping the roll-shaped cleaning member in each of the cleaning position and the offset cleaning position.

Therefore, each of the positions where the roll-shaped cleaning member is stopped can be reached with good reproducibility because it is mechanically regulated by the stopper. The stopper can easily and quickly be adjusted in position.

In a preferred aspect of the present invention, the offset cleaning position includes a plurality of offset cleaning positions, and the time during which the roll-shaped cleaning member dwells in each of the offset cleaning positions is proportional to the distance between each of the offset cleaning positions and the central axis of the substrate.

According to the present invention, the contact density between the roll-shaped cleaning member and the surface to be cleaned of the substrate is adjusted to make uniform the cleaning intensity over the entire surface to be cleaned of the substrate. The cleaning intensity is thus prevented from being unduly intensive in the vicinity of the central area of the substrate, thereby preventing local interconnects from being corroded, preventing the surface to be cleaned of the substrate from developing surface irregularities, and increasing the efficiency with which to clean the substrate.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 3:
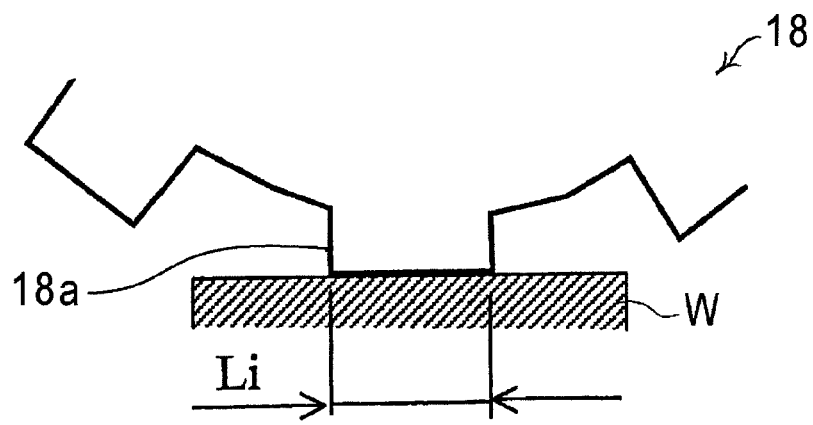
FIG. 3 is an enlarged fragmentary cross-sectional view of a roll brush used as a roll-shaped cleaning member in the conventional substrate cleaning apparatus and substrate cleaning apparatuses according to embodiments of the present invention, and a surface to be cleaned of a substrate.
Figure 4:
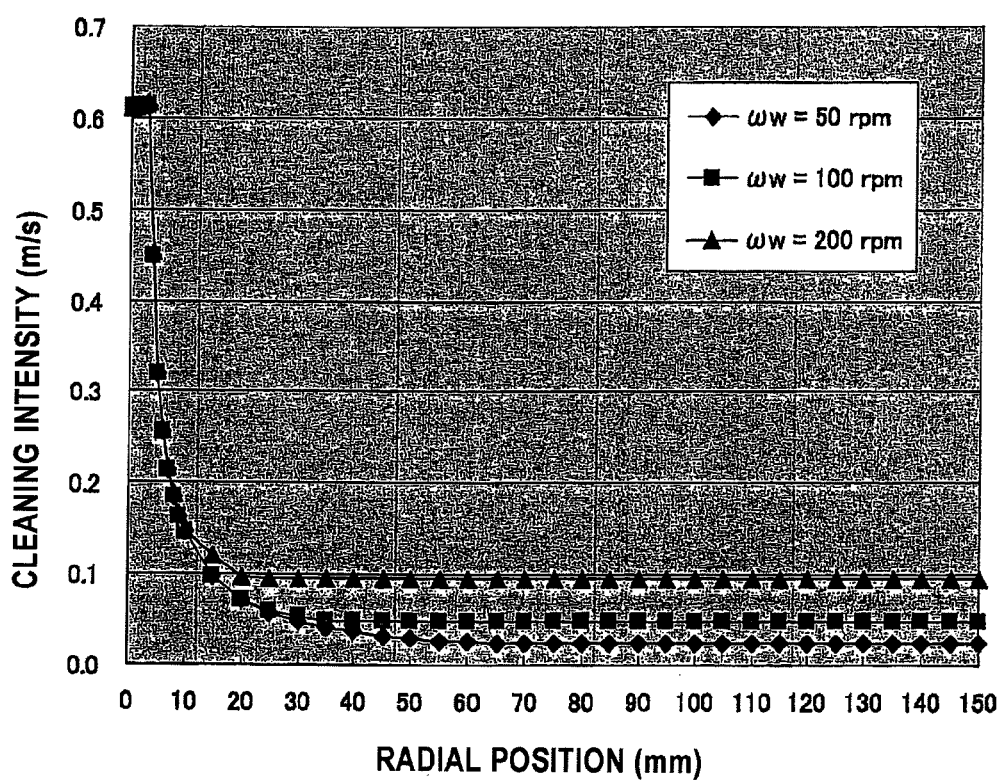
FIG. 4 is a graph showing the relationship between the cleaning intensity and the radius of a substrate when a front surface of the substrate is cleaned by a roll brush at the time the roll brush rotates at a constant rotational speed of 100 rpm and the substrate rotates at different rotational speeds of 50 rpm, 100 rpm, and 200 rpm, using the substrate cleaning apparatus shown in FIGS. 1 and 2.
Figure 5:
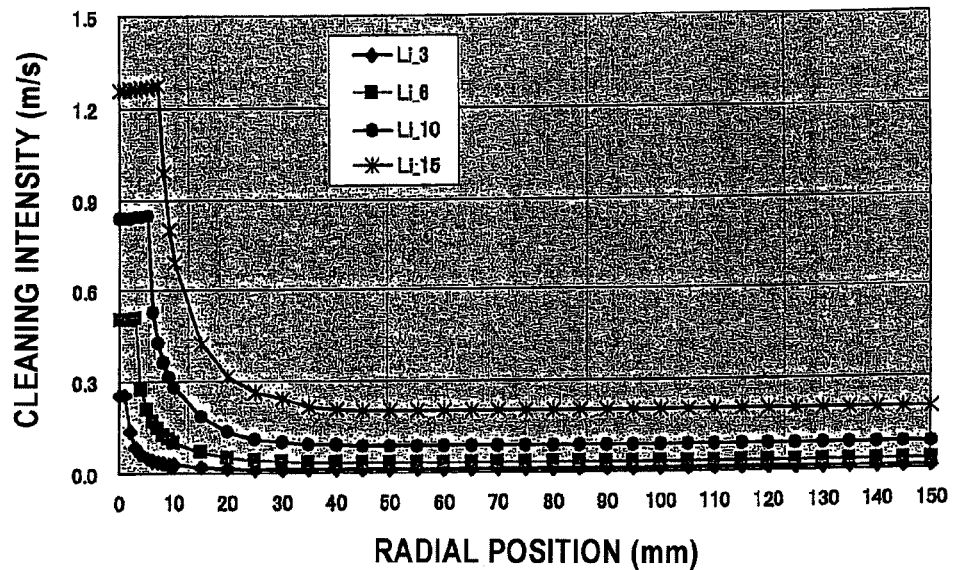
FIG. 5 is a graph showing the relationship between the cleaning intensity and the radius of a substrate when the substrate is cleaned by roll brushes with nodules contacting the substrate across contact widths of 3 mm, 6 mm, 10 mm, and 15 mm, using the substrate cleaning apparatus shown in FIGS. 1 and 2.
Figure 6:
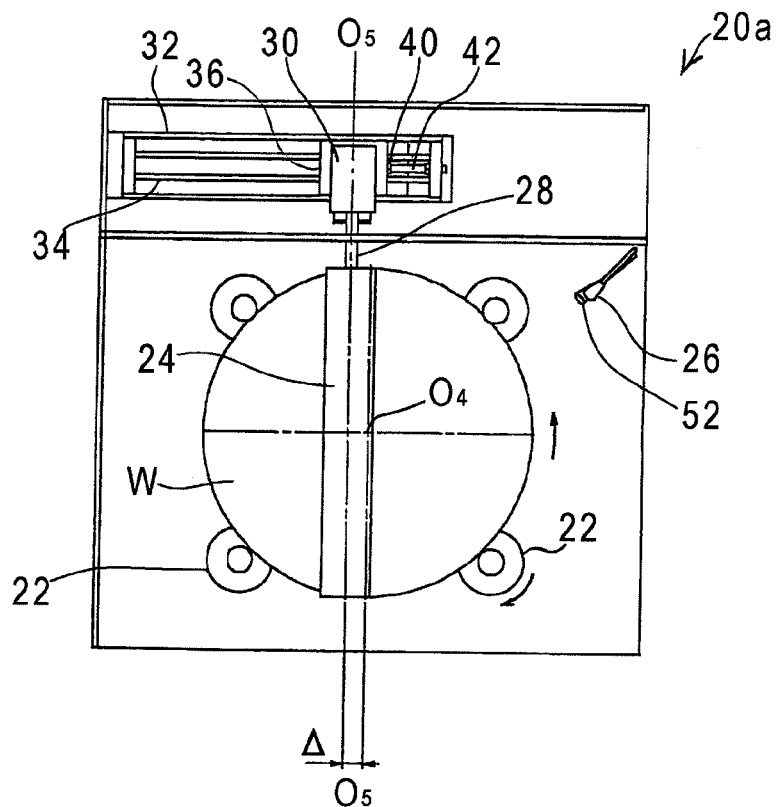
FIG. 6 is a plan view of a substrate cleaning apparatus according to an embodiment of the present invention.
Figure 7:
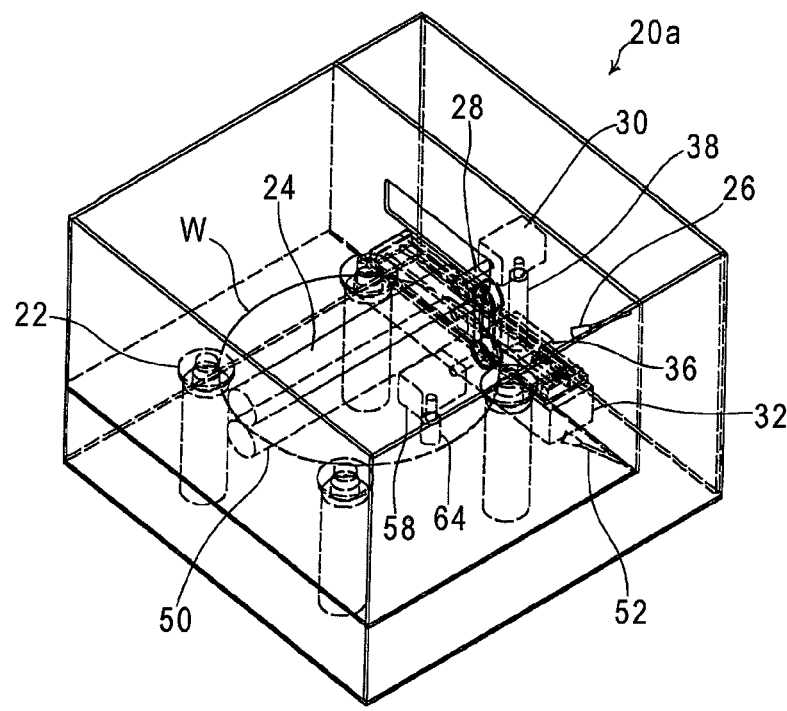
FIG. 7 is a perspective view of the substrate cleaning apparatus according to the embodiment of the present invention.
Figure 8:
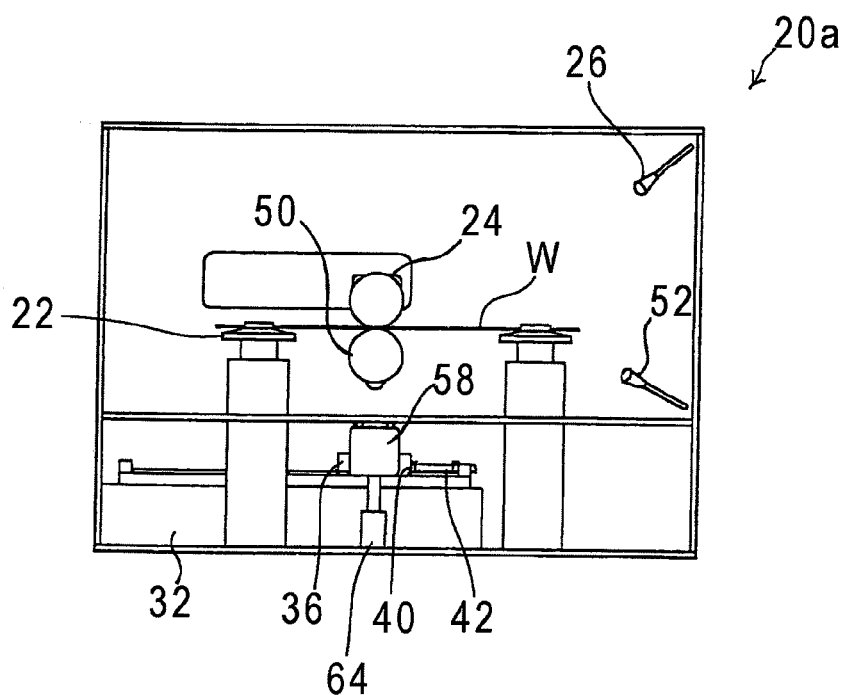
FIG. 8 is a front view, partly in vertical cross section, of the substrate cleaning apparatus according to the embodiment of the present invention.
Figure 9:
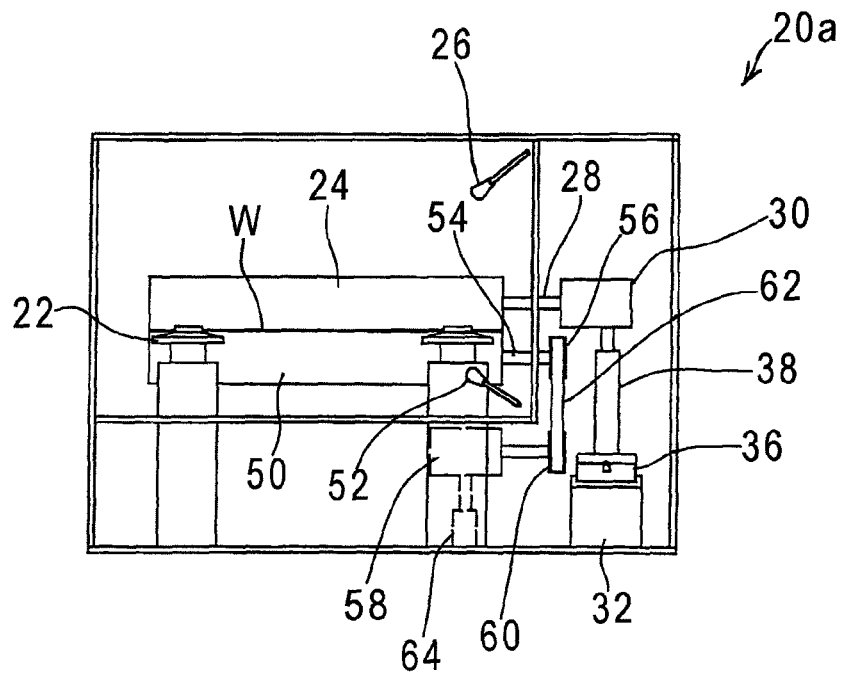
FIG. 9 is a side view, partly in vertical cross section, of the substrate cleaning apparatus according to the embodiment of the present invention.

Preferred embodiments of the present invention will now be described in detail with reference to the drawings. Each of the substrate cleaning apparatuses according to the embodiments described below employs, as each of its upper and lower roll brushes, the roll brush 18, as shown in FIG. 3, with the cylindrical nodules (protrusions) 18a on its outer circumferential surface, the nodules 18a having projecting distal end faces held in contact with the surface to be cleaned of the substrate W across the contact width Li. The same or equivalent members are given the same reference numerals, and a duplicate description thereof is omitted.

FIGS. 6 through 9 show a substrate cleaning apparatus 20a according to an embodiment of the present invention. The substrate cleaning apparatus 20a includes a plurality of (four in the illustrated embodiment) rotating rollers 22 for gripping a peripheral edge of a substrate W, such as a semiconductor wafer or the like, to hold the substrate W horizontally. When the rotating rollers 22 rotate about their own axes, the substrate W horizontally held thereby is rotated about its own central axis $O_4$ by the rotating rollers 22.

The substrate cleaning apparatus 20a also includes an upper roll brush (roll-shaped cleaning member) 24 disposed in contact with a front surface (upper surface) of the substrate W for scrubbing the front surface of the substrate W, and an upper cleaning liquid supply nozzle 26 for supplying a cleaning liquid to the front surface of the substrate W. The upper roll brush 24 and the upper cleaning liquid supply nozzle 26 are positioned upwardly of the substrate W held by rotating rollers 22. As described above, the upper roll brush 24 comprises the roll brush 18 (see FIG. 3) with the cylindrical nodules (protrusions) 18a (contact width: Li) on its outer circumferential surface. The upper roll brush 24 has a rotating shaft 28 extending in alignment with its own central axis $O_5$ and having a projecting end coupled to a drive motor 30. The driver motor 30 rotates the upper roll brush 24 about its own central axis $O_5$ through the rotating shaft 28.

The substrate cleaning apparatus 20a also includes a propulsive cylinder 32 as a moving mechanism positioned alongside of the substrate W held by the rotating rollers 22, a carriage 36 movable along a linear guide 34 by the propulsive cylinder 32 in a horizontal plane along directions perpendicular to the central axis $O_5$ of the upper roll brush 24, and a lifting cylinder 38 vertically mounted on an upper surface of the carriage 36. The lifting cylinder 38 has an upwardly extending piston rod having an upper end coupled to the drive motor 30. A stopper 40 is disposed in a predetermined position along the linear guide 34 for abutting against an end face of the carriage 36 to stop moving the carriage 36 for thereby positioning the upper roll brush 24 in a horizontal plane along directions perpendicular to the central axis $O_4$ of the substrate W held by the rotating rollers 22. In this embodiment, the stopper 40 comprises a head of a bolt 42 threaded in an end wall of the linear guide 34. The stopper 40 can thus be positionally adjusted along the linear guide 34 by turning the bolt 42 about its own central axis. The bolt 42 serves as a stop position adjuster for adjusting the position of the stopper 40.

The stopper 40 is positioned to stop the upper roll brush 24 at an offset cleaning position where the central axis $O_5$ thereof is spaced from the central axis $O_4$ of the substrate W by a distance which is 0.14 to 0.5 times the contact width Li (see FIG. 3). In other words, the offset distance Δ of the central axis $O_5$ of the upper roll brush 24 from the central axis $O_4$ of the substrate W is in the range from 0.14 to 0.5 times the contact width Li (Δ=0.14−0.5 Li). The position of the stopper 40 can easily be adjusted by the bolt (stop position adjuster) 42.

The substrate cleaning apparatus 20a further includes a lower roll brush (roll-shaped cleaning member) 50 disposed in contact with a back surface (lower surface) of the substrate W for scrubbing the back surface of the substrate W, and a lower cleaning liquid supply nozzle 52 for supplying a cleaning liquid to the back surface of the substrate W. The lower roll brush 50 and the lower cleaning liquid supply nozzle 52 are positioned downwardly of the substrate W held by the rotating rollers 22. As described above, the lower roll brush 50 comprises the roll brush 18, as shown in FIG. 3, with the cylindrical nodules (protrusions) 18a on its outer circumferential surface.

The lower roll brush 50 has a rotating shaft 54 extending in alignment with its own central axis $O_6$ and having a projecting end coupled to a driven pulley 56. A drive motor 58, disposed below the lower roll brush 50, has a drive pulley 60 fixed to its output shaft. An endless belt 62 is trained around the driven pulley 56 and the drive pulley 60. When the drive motor 58 is energized, the lower roll brush 50 is rotated about its own central axis $O_6$ by the drive pulley 60, the endless belt 62, and the driven pulley 56. A lifting cylinder 64 is disposed below the drive motor 58 for lifting and lowering the drive motor 58 and the lower roll brush 50 in unison with each other.

In this embodiment, as with the upper roll brush 24, when the back surface of the substrate W is scrubbed, the lower roll brush 50 is disposed at an offset cleaning position where the central axis $O_6$ thereof is spaced from the central axis $O_4$ of the substrate W by an offset distance Δ which is 0.14 to 0.5 times the contact width Li (Δ=0.14−0.5 Li).

If the back surface of the substrate W needs to be scrubbed to a lower level, for example, then the lower roll brush 50 may be disposed in a position where the central axis $O_6$ thereof crosses the central axis $O_4$ of the substrate W when the back surface of the substrate W is scrubbed. Alternatively, as with the upper roll brush 24, the lower roll brush 50 may be movable in a horizontal plane along directions perpendicular to the central axis $O_4$ of the substrate W, and may be positioned in a desired cleaning position by a stopper or the like.

The substrate cleaning apparatus 20a of this embodiment operates as follows: First, the substrate W to be cleaned is held by the rotating rollers 22 horizontally. The propulsive cylinder 32 is actuated to move the carriage 36 along the linear guide 32 until the carriage 36 abuts against the stopper 40, whereupon the upper roll brush 24 is positioned at the offset cleaning position. Then, the rotating rollers 22 are rotated about their axes to rotate the substrate W about its own central axis $O_4$ at a rotational speed of about 100 rpm.

In this state, the upper cleaning liquid supply nozzle 26 supplies a cleaning liquid to the front surface (upper surface) of the substrate W. At the same time, the upper roll brush 24, while in rotation about the central axis $O_5$, is lowered to come into contact with the front surface of the substrate W thereby to scrub the front surface of the substrate W by the upper roll brush 24. While the front surface of the substrate W is being thus scrubbed by the upper roll brush 24, as shown in FIG. 3, one of the distal end faces of the nodules 18a of the roll brush 18, which is used as the upper roll brush 24, contacts the front surface of the substrate W across the contact width Li.

The lower cleaning liquid supply nozzle 52 also supplies a cleaning liquid to the back surface (lower surface) of the substrate W. At the same time, the lower roll brush 50, while in rotation about the central axis $O_6$, is elevated to come into contact with the back surface of the substrate W thereby to scrub the back surface of the substrate W by the lower roll brush 50.

After the substrate W is scrubbed, the upper roll brush 24 is lifted and the lower roll brush 50 is lowered. Then, the upper cleaning liquid supply nozzle 26 and the lower cleaning liquid supply nozzle 52 stop supplying the cleaning liquid, and the rotating rollers 22, the upper roll brush 24, and the lower roll brush 50 stop rotating about their own axes.

Figure 10:
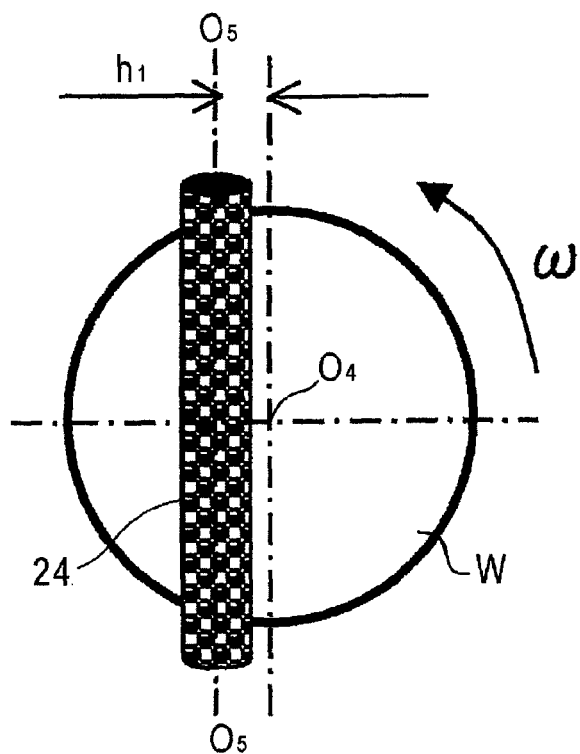
FIG. 10 is a plan view showing the relationship between an upper roll brush and a substrate in the substrate cleaning apparatus shown in FIGS. 6 through 9.
Figure 11:
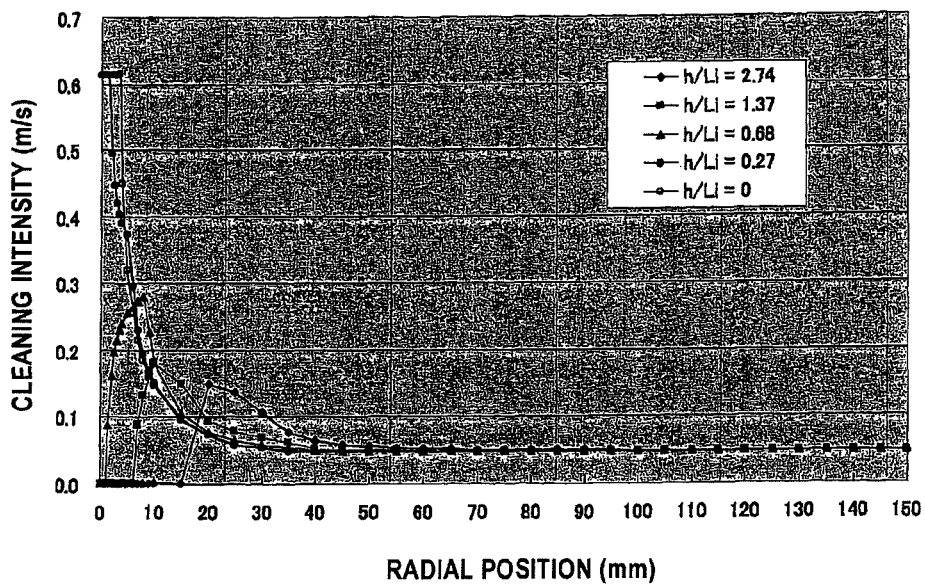
FIG. 11 is a graph showing the relationship between the cleaning intensity and the radius of the substrate when a front surface of the substrate is cleaned by the upper roll brush with different ratios of 0, 0.27, 0.68, 1.37, and 2.74 of offset distances of the central axis of the upper roll brush from the central axis of the substrate to the contact width, using the substrate cleaning apparatus shown in FIGS. 6 through 9.

As described above, the offset distance $\Delta$ of the central axis $O_5$ of the upper roll brush 24 and also the central axis $O_6$ of the lower roll brush 50 from the central axis $O_4$ of the substrate W is in the range from 0.14 to 0.5 times the contact width Li, i.e., the diameter of the nodules 18a. The offset distance $\Delta$ is in the range from 0.14 to 0.5 times the contact width Li for the following reasons:

As shown in FIG. 10, it is assumed that the central axis $O_5$ of the upper roll brush 24 is offset from the central axis $O_4$ of the substrate W by an offset distance $h_1$. FIG. 11 shows the calculated relationship between the above-described cleaning intensity $R_c$ and the radius r of the substrate W when the front surface of the substrate W is cleaned by the upper roll brush 24 at different ratios ($h_1$/Li) of 0, 0.27, 0.68, 1.37, and 2.74 of offset distances $h_1$ to the contact width Li. Table 2, below, shows calculated relative values (uniformity) 1σ of the standard deviation of the cleaning intensity $R_c$ when the front surface of the substrate W is cleaned by the upper roll brush 24 at different ratios ($h_1$/Li) of 0, 0.14, 0.27, 0.41, 0.50, 0.55, 0.68, 1.37, 2.74, 4.11, 4.79, and 5.48 of offset distances $h_1$ to the contact width Li.

It can be seen from FIG. 11 that if the ratio ($h_1$/Li) of the offset distance $h_1$ to the contact width Li is smaller than 0.5 ($h_1$/Li<0.5), then the range where the cleaning intensity is intensive in a central area of the substrate W is small and the uniformity 1σ is small, and if the ratio ($h_1$/Li) of the offset distance $h_1$ to the contact width Li is greater than 0.5 ($h_1$/Li>0.5), then there is no singular point where the cleaning intensity is intensive in the central area of the substrate W and the uniformity 1σ is smaller, but there is developed a region which cannot be cleaned in the central area of the substrate W. It can be understood from Table 2 that if the ratio ($h_1$/Li) of the offset distance $h_1$ to the contact width Li is greater than 0.14 ($h_1$/Li>0.14), then it becomes effective on the uniformity 1σ. Therefore, when the substrate W is to be cleaned by the upper roll brush 24 which is fixed in position, it is desirable that the ratio ($h_1$/Li) of the offset distance $h_1$ to the contact width Li be greater than 0.14 and smaller than 0.50.

Figure 12:
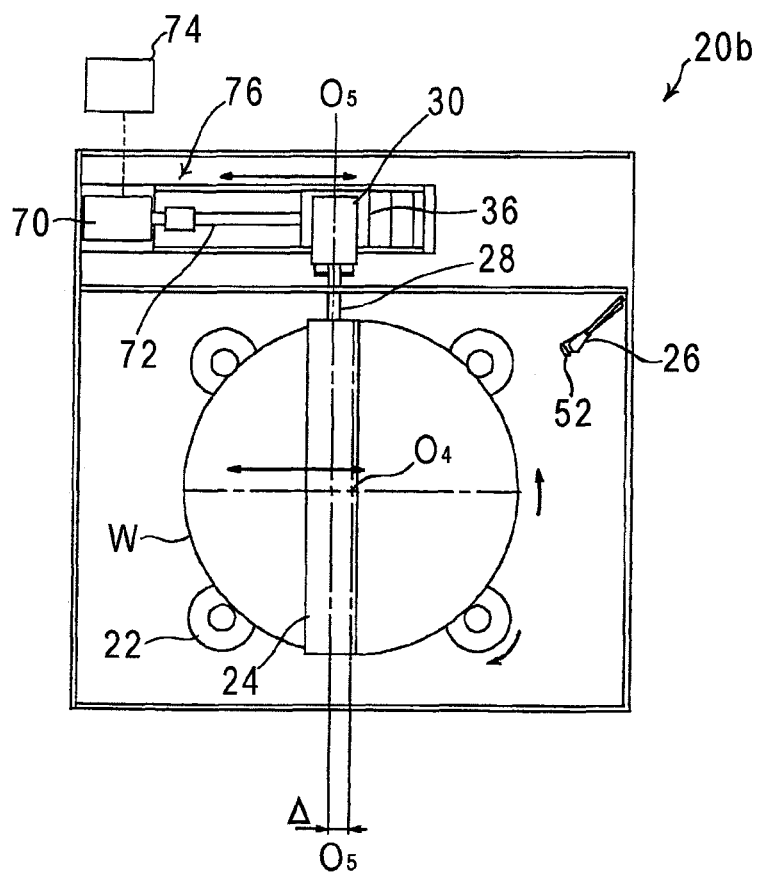
FIG. 12 is a plan view of a substrate cleaning apparatus according to another embodiment of the present invention.
Figure 13:
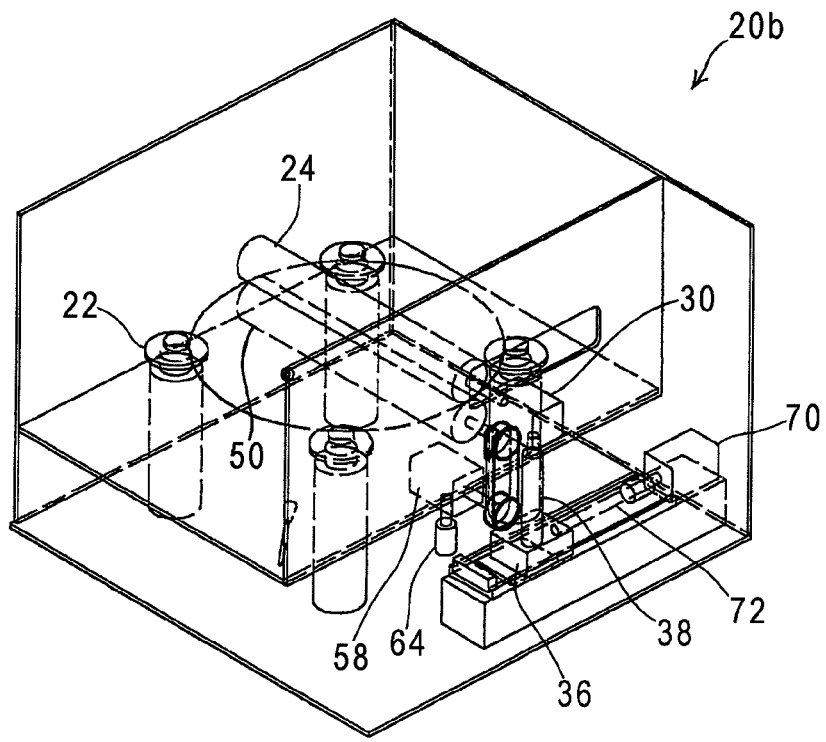
FIG. 13 is a perspective view of the substrate cleaning apparatus according to the other embodiment of the present invention.
Figure 14:
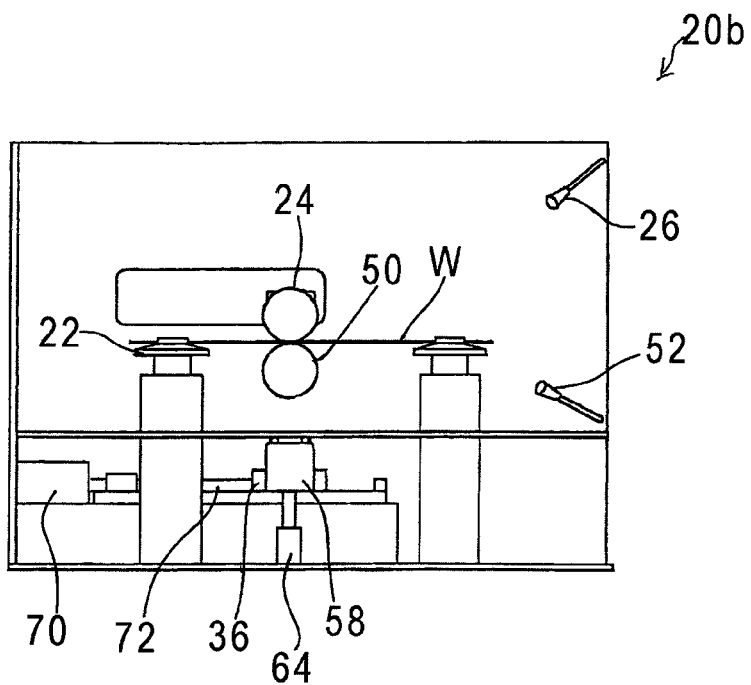
FIG. 14 is a front view, partly in vertical cross section, of the substrate cleaning apparatus according to the other embodiment of the present invention.

FIGS. 12 through 14 show a substrate cleaning apparatus 20b according to another embodiment of the present invention. This substrate cleaning apparatus 20b includes a reciprocating mechanism 76 comprising a propulsive motor 70 which is reversible and whose rotational speed can be controlled, a linear mechanism 72, such as a ball screw or the like, interconnecting an output shaft of the propulsive motor 70 and a carriage 36, and controller 74 for controlling the propulsive motor 70. The reciprocating mechanism 76 reciprocally moves the carriage 36 in unison with an upper roll brush 24 in a horizontally plane along directions perpendicular to the central axis $O_4$ of a substrate W held by the rotating rollers 22. When the propulsive motor 70 is energized to rotate its output shaft in one direction, the carriage 36 moves in unison with the upper roller brush 24 to the right in FIG. 12, for example. When the propulsive motor 70 is reversed, the carriage 36 moves in unison with the upper roller brush 24 to the left in FIG. 12, for example. The speed at which the carriage 36 moves, the position at which the carriage 36 stops, and the time during which the carriage 36 dwells or stops are controlled when the controller 74 controls the speed at which and the direction in which the propulsive motor 70 rotates its output shaft.

In this embodiment, the reciprocating mechanism 76 reciprocally moves the carriage 36 to move the upper roll brush 24 between at least two cleaning positions, i.e., a cleaning position where the central axis $O_5$ of the upper roll brush 24 and the central axis $O_4$ of the substrate W cross each other and an offset cleaning position where the central axis $O_5$ of the upper roll brush 24 is spaced from the central axis $O_4$ of the substrate W by an offset distance $\Delta$.

The substrate cleaning apparatus 20b cleans the front surface of the substrate W as follows: The substrate cleaning apparatus 20b can clean the front surface of the substrate W in three cleaning processes, i.e., a first cleaning process, a second cleaning process, and a third cleaning process.

Figure 15:
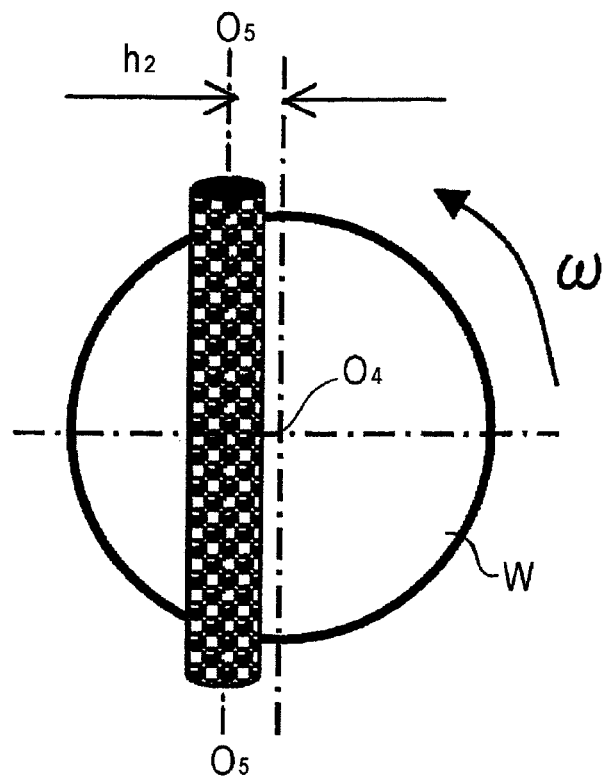
FIG. 15 is a plan view showing a first relationship between the upper roll brush and the substrate in the substrate cleaning apparatus shown in FIGS. 12 through 14.

In the first cleaning process, the upper roll brush 24 cleans the front surface of the substrate W when the upper roll brush 24 is in three cleaning positions including: a first cleaning position (central cleaning position) where an offset distance $h_2$ (see FIG. 15) between the central axis $O_5$ of the upper roll brush 24 and the central axis $O_4$ of the substrate W is 0 mm;

TABLE 2

| $h_1$/Li | 0 | 0.14 | 0.27 | 0.41 | 0.50 | 0.55 | 0.68 | 1.37 | 2.74 | 4.11 | 4.79 | 5.48 |
|---|---|---|---|---|---|---|---|---|---|---|---|---|
| Uniformity 1 σ % | 119 | 117 | 113 | 105 | 97 | 87 | 89 | 87 | 96 | 96 | 101 | 110 | a first offset cleaning position where the offset distance $h_2$ is 10 mm, for example; and a second offset cleaning position where the offset distance $h_2$ is 20 mm, for example. Specifically, the upper roll brush 24 is placed in the first cleaning position (central cleaning position) and cleans the front surface of the substrate W for a predetermined time. Thereafter, the upper roll brush 24 is placed in the first offset cleaning position and cleans the front surface of the substrate W for a predetermined time. Thereafter, the upper roll brush 24 is placed in the second offset cleaning position and cleans the front surface of the substrate W for a predetermined time. Then, the upper roll brush 24 is placed back in the first offset cleaning position and cleans the front surface of the substrate W for a predetermined time. Thereafter, the upper roll brush 24 is placed back in the first cleaning position (central cleaning position) and cleans the front surface of the substrate W for a predetermined time. Subsequently, the above cleaning sequence is repeated.

Figure 16:
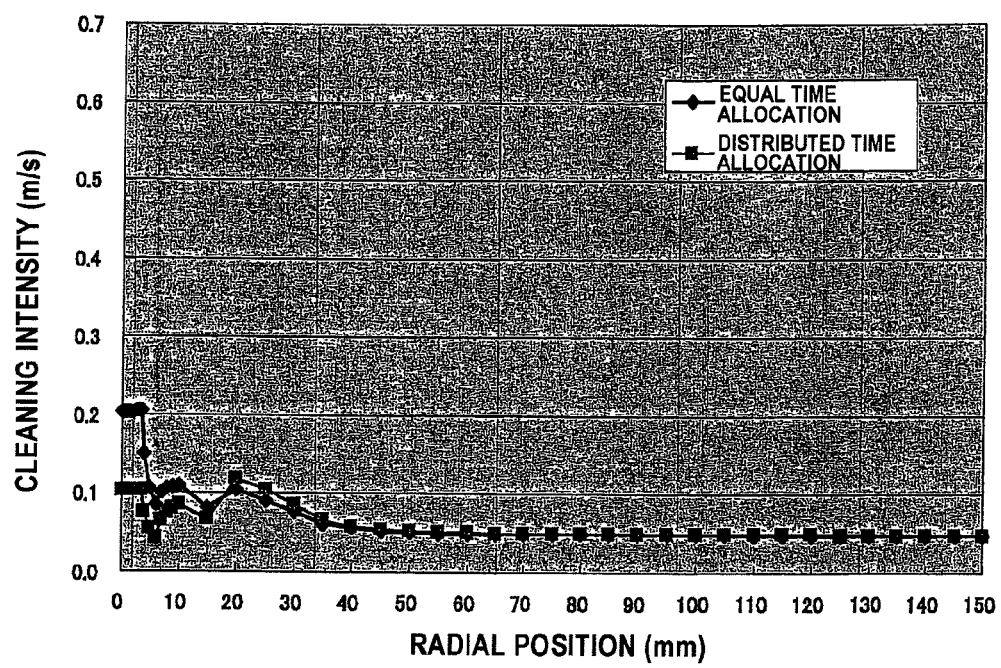
FIG. 16 is a graph showing the relationship between the cleaning intensity and the radius of the substrate when the upper roll brush dwells in different cleaning positions (three positions) for equal times (equal time allocation) to clean the front surface of the substrate and when the upper roll brush dwells in the different cleaning positions for different times (distributed time allocation) to clean the front surface of the substrate, using the substrate cleaning apparatus shown in FIGS. 12 through 14.

Now, it is assumed that the upper roll brush 24 dwells for equal times respectively in the cleaning positions (equal time allocation) when it cleans the front surface of the substrate W, or specifically, the upper roll brush 24 cleans the front surface of the substrate W for a cleaning time (dwelling time): $t_1$ in the first cleaning position (central cleaning position), cleans the front surface of the substrate W for a cleaning time (dwelling time): $t_2$ in the first offset cleaning position, and cleans the front surface of the substrate W for a cleaning time (dwelling time): $t_3$ in the second offset cleaning position, the cleaning times $t_1, t_2, t_3$ being equal to each other ($t_1=t_2=t_3$), and that the upper roll brush 24 dwells for different times respectively in the cleaning positions (distributed time allocation) when it cleans the front surface of the substrate W, or specifically, the upper roll brush 24 cleans the front surface of the substrate W for a cleaning time (dwelling time): $t_1$ in the first cleaning position (central cleaning position), cleans the front surface of the substrate W for a cleaning time (dwelling time): $t_2$ in the first offset cleaning position, and cleans the front surface of the substrate W for a cleaning time (dwelling time): $t_3$ in the second offset cleaning position, the cleaning times $t_1, t_2, t_3$ being different from each other at a ratio of 1:2:3 depending on the offset distance $h_2$ ($t_1:t_2:t_3=1:2:3$). FIG. 16 shows the calculated relationship between the above-described cleaning intensity $R_c$ and the radius r of the substrate W for the equal time allocation and the distributed time allocation. Table 3, below, shows calculated relative values (uniformity) 1σ of the standard deviation of the cleaning intensity $R_c$ for the equal time allocation and the distributed time allocation.

TABLE 3

| | Dwelling time allocation | | | Cleaning |
|---|---|---|---|---|
| | $h_2=$ 0 mm | $h_2=$ 10 mm | $h_2=$ 20 mm | intensity uniformity 1 σ % |
| Equal time allocation | 1 | 1 | 1 | 65 |
| Distributed time allocation | 1 | 2 | 3 | 35 |

It can be seen from FIG. 16 and Table 3 that the cleaning intensity can be suppressed dramatically from being intensive in the central area of the substrate W for both the equal time allocation and the distributed time allocation. In particular, it can be understood that the cleaning intensity over the entire front surface, i.e., the surface to be cleaned, of the substrate W is more uniform when the cleaning times (dwelling times) in the respective cleaning positions are different from each other (1:2:3) (distributed time allocation) than when the cleaning times (dwelling times) in the respective cleaning positions are equal to each other (equal time allocation), and the cleaning intensity uniformity 1σ is improved from 65% for the equal time allocation to 35% for the distributed time allocation. When the upper roll brush 24 is moved to each of the above cleaning positions, the upper roll brush 24 should remain in contact with the front surface of the substrate W thereby to omit any adjustment times which would otherwise be needed if the upper roll brush 24 were lifted off the front surface of the substrate W.

In the second cleaning process, the upper roll brush 24 cleans the front surface of the substrate W when the upper roll brush 24 is in two cleaning positions, i.e., the first cleaning position (central cleaning position) where an offset distance $h_2$ (see FIG. 15) between the central axis $O_5$ of the upper roll brush 24 and the central axis $O_4$ of the substrate W is 0 mm, and the second offset cleaning position where the offset distance $h_2$ is 20 mm, for example.

Figure 17:
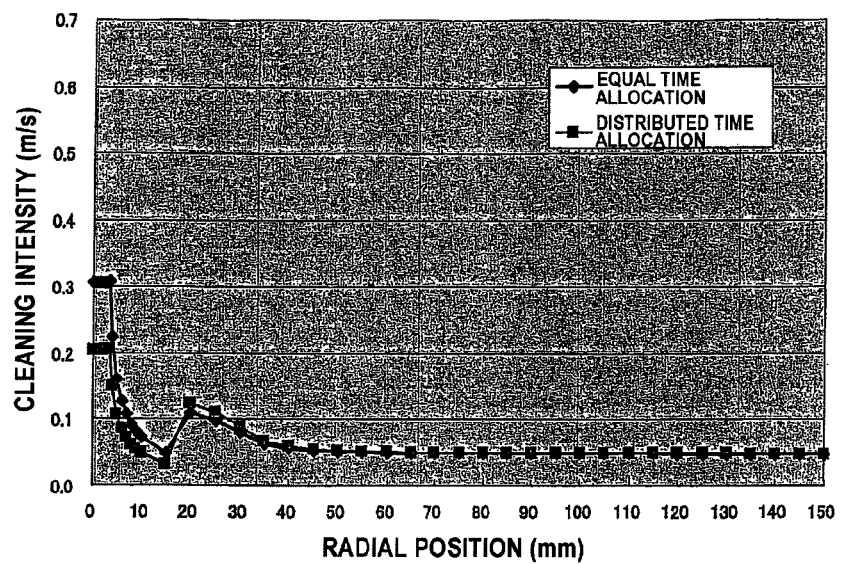
FIG. 17 is a graph showing the relationship between the cleaning intensity and the radius of the substrate when the upper roll brush dwells in different cleaning positions (two positions) for equal times (equal time allocation) to clean the front surface of the substrate and when the upper roll brush dwells in the different cleaning positions for different times (distributed time allocation) to clean the front surface of the substrate, using the substrate cleaning apparatus shown in FIGS. 12 through 14.

It is assumed that the upper roll brush 24 dwells for equal times respectively in the cleaning positions (equal time allocation) when it cleans the front surface of the substrate W, or specifically, the upper roll brush 24 cleans the front surface of the substrate W for a cleaning time (dwelling time): $t_1$ in the first cleaning position (central cleaning position), and cleans the front surface of the substrate W for a cleaning time (dwelling time): $t_3$ in the second offset cleaning position, the cleaning times $t_1, t_3$ being equal to each other ($t_1=t_3$), and that the upper roll brush 24 dwells for different times respectively in the cleaning positions (distributed time allocation) when it cleans the front surface of the substrate W, or specifically, the upper roll brush 24 cleans the front surface of the substrate W for a cleaning time (dwelling time): $t_1$ in the first cleaning position (central cleaning position), and cleans the front surface of the substrate W for a cleaning time (dwelling time): $t_3$ in the second offset cleaning position, the cleaning times $t_1, t_3$ being different from each other at a ratio of 1:2 depending on the offset distance $h_2$ ($t_1:t_3=1:2$). FIG. 17 shows the calculated relationship between the above-described cleaning intensity $R_c$ and the radius r of the substrate W for the equal time allocation and the distributed time allocation. Table 4, below, shows calculated relative values (uniformity) 1σ of the standard deviation of the cleaning intensity $R_c$ for the equal time allocation and the distributed time allocation.

TABLE 4

| | Dwelling time allocation | | Cleaning |
|---|---|---|---|
| | $h_2=$ 0 mm | $h_2=$ 20 mm | intensity uniformity 1 σ % |
| Equal time allocation | 1 | 1 | 89 |
| Distributed time allocation | 1 | 2 | 70 |

It can be seen from FIG. 17 and Table 4 that the cleaning intensity can be suppressed dramatically from being intensive in the central area of the substrate W for both the equal time allocation and the distributed time allocation. In particular, it can be understood that the cleaning intensity over the entire front surface, i.e., the surface to be cleaned, of the substrate W is more uniform when the cleaning times (dwelling times) in the respective cleaning positions are different from each other (1:2) (distributed time allocation) than when the cleaning times (dwelling times) in the respective cleaning positions are equal to each other (equal time allocation), and the cleaning intensity uniformity 1σ is improved from 89% for the equal time allocation to 70% for the distributed time allocation.

The two cleaning positions in the second cleaning process make the cleaning intensity less uniform over the entire surface to be cleaned of the substrate W than the three cleaning positions in the first cleaning process, but allow the substrate cleaning apparatus to be simpler in structure as the number of offset cleaning positions is smaller.

Figure 18:
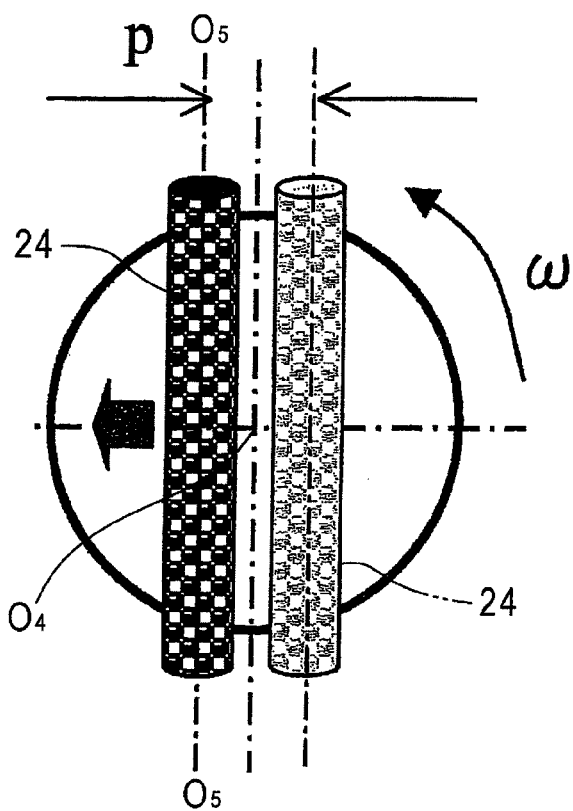
FIG. 18 is a plan view showing a second relationship between the upper roll brush and the substrate in the substrate cleaning apparatus shown in FIGS. 12 through 14.

In the third cleaning process, the upper roll brush 24 cleans the front surface of the substrate W while reciprocally moving within a distance p (see FIG. 18) which extends equally on both sides of the central axis $O_4$ of the substrate W held by the rotating rollers 22. The distance p or range of movement of the upper roll brush 24 is set within 16 times the contact width Li shown in FIG. 3 (p<16 Li).

Figure 1:
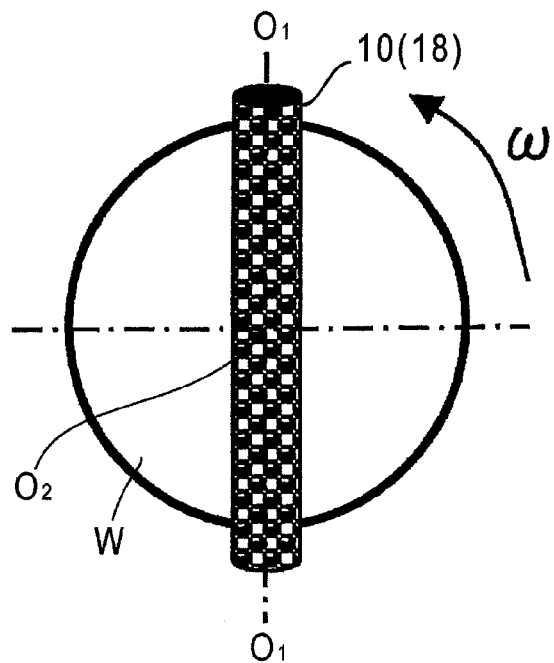
FIG. 1 is a schematic plan view of a conventional substrate cleaning apparatus.
Figure 2:
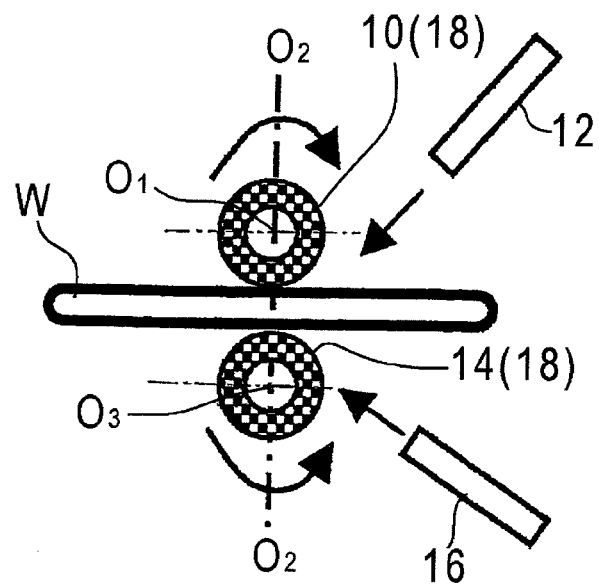
FIG. 2 is a front view, partly in vertical cross section, of the conventional substrate cleaning apparatus.

The third cleaning process is based on the fact that when the upper roll brush 10 (see FIG. 1) is placed in the position where the central axis $O_1$ thereof and the central axis $O_2$ of the substrate W cross each other and the substrate W is cleaned by roll brushes 18, used as the upper roll brush 10, with nodules 18a having diameters (contact widths Li) of 3 mm, 6 mm, 10 mm, and 15 mm, in a practical range of contact widths, i.e., from 3 mm to 10 mm, the ratio (r/Li) of the radial position r of the substrate W to the contact width Li at the time the cleaning intensity $R_c$ is 20% higher than the flat value thereof is about 8 or smaller, as shown in Table 1 above. In other words, it is possible to prevent the cleaning intensity $R_c$ from becoming 20% or more higher than the flat value thereof by setting the range p of movement within 16 times the contact width Li.

In this embodiment, the range p of movement is set to 40 mm (p=40 mm), for example. In order to change the time at which the upper roll brush 24 contacts each position on the front surface of the substrate W while the upper roll brush 24 is in motion, the upper roll brush 24 is controlled such that the speed at which it moves is the highest when the upper roll brush 24 passes through the central axis of the substrate W and becomes progressively lower as the upper roll brush 24 moves away from the central axis of the substrate W. The speed at which the upper roll brush 24 moves has a speed coefficient V (dimensionless) expressed according to the following equation:

$$V = \sin\left[\left(\frac{x}{p} + \frac{1}{2}\right)\pi\right] + V_c$$

where $V_c$ represents the constant of the movement coefficient and x the distance (offset distance) from the central axis of the substrate W to the upper roll brush 24.

Figure 19:
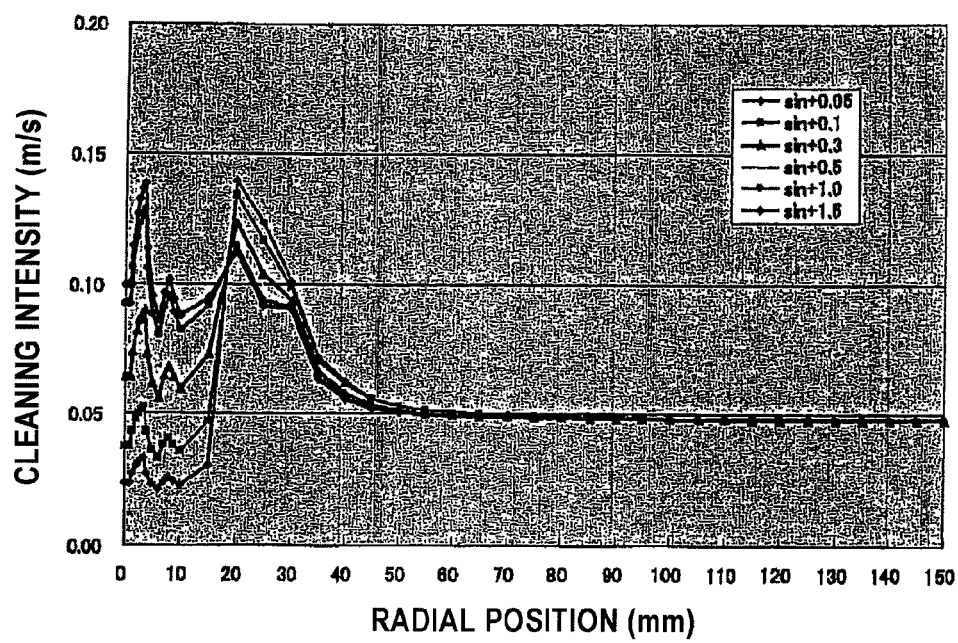
FIG. 19 is a graph showing the relationship between the cleaning intensity and the radius of the substrate when the front surface of the substrate is cleaned with a movement coefficient having different constants of 0.05, 0.1, 0.3, 0.5, 1.0, and 1.5, using the substrate cleaning apparatus shown in FIGS. 12 through 14.
Figure 20:
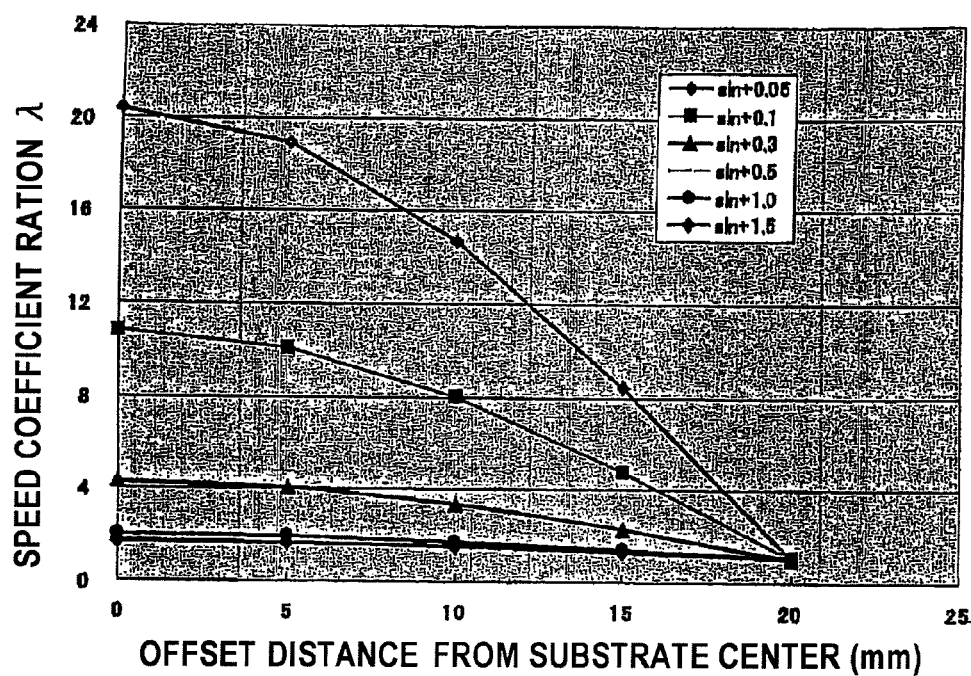
FIG. 20 is a graph showing the relationship between distances (offset distances) from the central axis of the substrate to the upper roll brush and speed coefficient ratios when the front surface of the substrate is cleaned with a movement coefficient having different constants of 0.05, 0.1, 0.3, 0.5, 1.0, and 1.5, using the substrate cleaning apparatus shown in FIGS. 12 through 14.

FIG. 19 shows the relationship between the calculated cleaning intensity $R_c$ and the radius r of the substrate W when the front surface of the substrate W is cleaned with a movement coefficient having different constants $V_c$ of 0.05, 0.1, 0.3, 0.5, 1.0, and 1.5. FIG. 20 shows the relationship between distances (offset distances) from the central axis of the substrate W to the upper roll brush 24 and speed coefficient ratios $\lambda$ ($=V_{max}/V_c$).

It can be seen from FIG. 20 that the ratios $\lambda$ ($=V_{max}/V_c$) between maximum speed coefficients $V_{max}$ and minimum speed coefficients $V_c$ at the time x (offset distance)=0 are 20.4, 10.8, 4.3, 3.0, 2.0, and 1.7. Table 5 shows calculated relative values (uniformity) 1σ of the standard deviation of the cleaning intensity $R_c$ at the maximum speed coefficient ratios $\lambda$ ($=V_{max}/V_c$).

TABLE 5

|  | sin + 0.05 | sin + 0.1 | sin + 0.3 | sin + 0.5 | sin + 1.0 | sin + 1.5 |
|---|---|---|---|---|---|---|
| $V_{max}/V_c$ | 20.4 | 10.8 | 4.3 | 3.0 | 2.0 | 1.7 |
| Uniformity 1 σ % | 53 | 38 | 29 | 32 | 38 | 41 |

It can be seen from Table 5 that the cleaning intensity can be suppressed dramatically from being intensive in the central area of the substrate W for any of the constants, and the relative value (uniformity) 1π of the standard deviation can be reduced to 40% or lower by setting the ratio (maximum speed coefficient ratios λ) between maximum speed coefficients $V_{max}$ and minimum speed coefficients $V_c$ to a range from 2 to 11, preferably a range from 3 to 11, and that the relative value (uniformity) 1σ of the standard deviation is minimum, i.e., 29%, when the constant $V_c$ of the speed coefficient is 0.3.

V referred to above represents a speed coefficient. A moving speed $U_1$ of the upper roll brush 24 at the time it actually cleans the front surface of the substrate W while passing the range p of movement once will be determined as described below. If the moving speed of the upper roll brush 24 is represented by $U_0 = V \times 1$ (m/s), then a time τ during which the upper roll brush 24 passes the range p of movement is determined according to the following equation:

$$\tau = \int_{-p/2}^{p/2} \frac{1}{U_0(x)} dx$$

If an actual processing time, i.e., a time during which the upper roll brush 24 passes the range p of movement once, is represented by t, then the moving speed $U_1$ of the upper roll brush 24 is determined according to the following equation:

$$U_1 = \tau \times U_0/t$$

The moving speed $U_1$ is of a value (time) when the upper roll brush 24 passes the range p of movement once. If the upper roll brush 24 needs to pass the range p of movement M times in the same processing time depending on the cleaning process, then the moving speed U of the upper roll brush 24 is expressed as:

$$M \times U_1 (U = M \times U_1)$$

Figure 21:
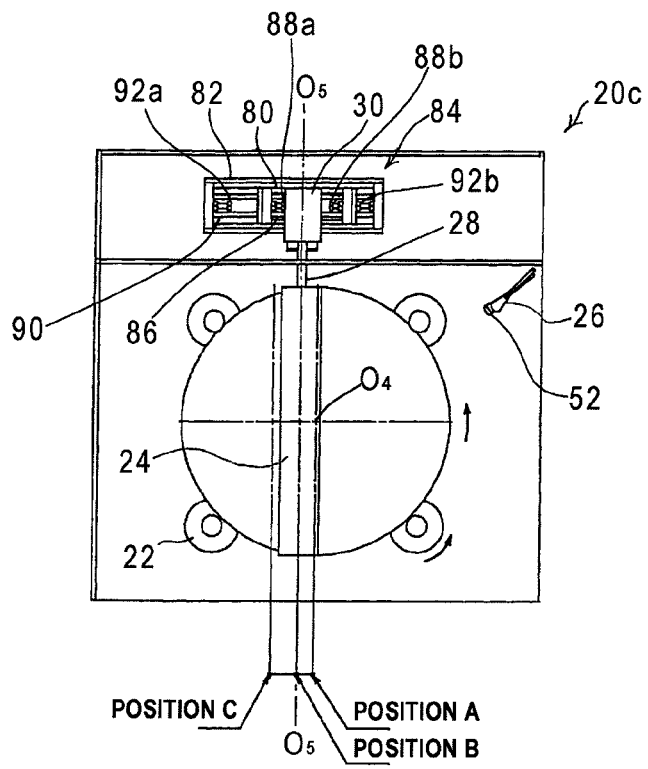
FIG. 21 is a plan view of a substrate cleaning apparatus according to still another embodiment of the present invention.
Figure 22:
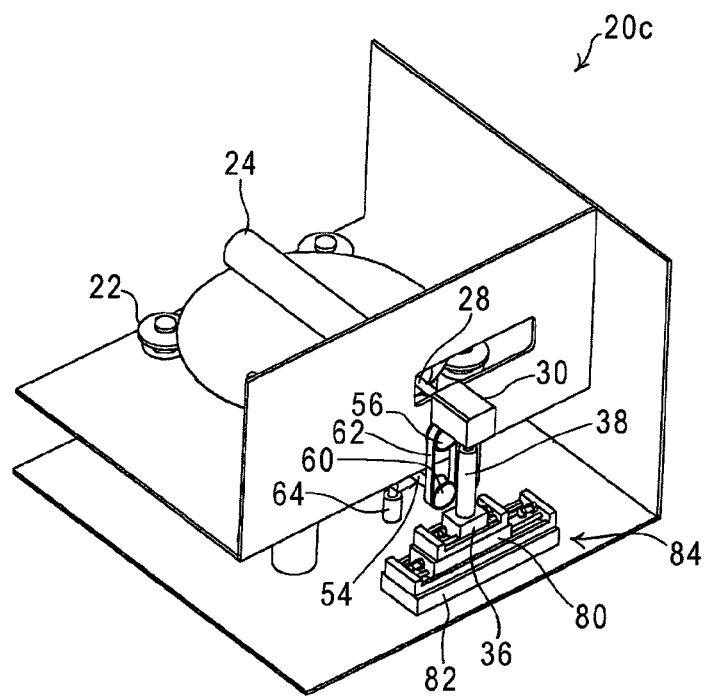
FIG. 22 is a perspective view of the substrate cleaning apparatus according to the still other embodiment of the present invention.

FIGS. 21 and 22 show a substrate cleaning apparatus 20c according to still another embodiment of the present invention. The substrate cleaning apparatus 20c is different from the substrate cleaning apparatus 20b in that a reciprocating mechanism 84 comprises a first propulsive cylinder 80 for moving a carriage 36 and a second propulsive cylinder 82 for moving the first propulsive cylinder 80 together with the carriage 36. The carriage 36 is guided to move along a linear guide 86. A pair of stoppers 88a, 88b are disposed in respective positions along the linear guide 86 for abutting against end faces of the carriage 36 to stop moving the carriage 36. The first propulsive cylinder 80 is guided to move along a linear guide 90. A pair of stoppers 92a, 92b are disposed in respective positions along the linear guide 90 for abutting against end faces of the first propulsive cylinder 80 to stop moving the first propulsive cylinder 80. Each of the stoppers 88a, 88b, 92a, 92b comprises a bolt threaded in an end wall of the linear guide 86, 90. Positions where the carriage 36 and the first propulsive cylinder 80 are to stop at positions along the linear guides 86, 90 can be adjusted by turning the bolts which serve as the stoppers 88a, 88b, 92a, 92b.

In this embodiment, when the carriage 36 is moved from a position in which it is held against the stopper 88a to a position in which it is held against the stopper 88b, the upper roll brush 24 is moved from a first offset cleaning position (position B in FIG. 21) to a central cleaning position (position A in FIG. 21). When the first propulsive cylinder 80 is moved in unison with the carriage 36 from a position in which it is held against the stopper 92a to a position in which it is held against the stopper 92b, the upper roll brush 24 is moved from a second offset cleaning position (position C in FIG. 21) to the first offset cleaning position (position B in FIG. 21). While the upper roll brush 24 is being thus moved, it scrubs the front surface of the substrate W.

The positions where the upper roll brush 24 is stopped, i.e., the cleaning positions, can be reached with good reproducibility because they are mechanically regulated by the stoppers 88a, 88b, 92a, 92b. As the stoppers 88a, 88b, 92a, 92b are in the form of bolts or the like, they can easily and quickly be adjusted in position.

Figure 23:
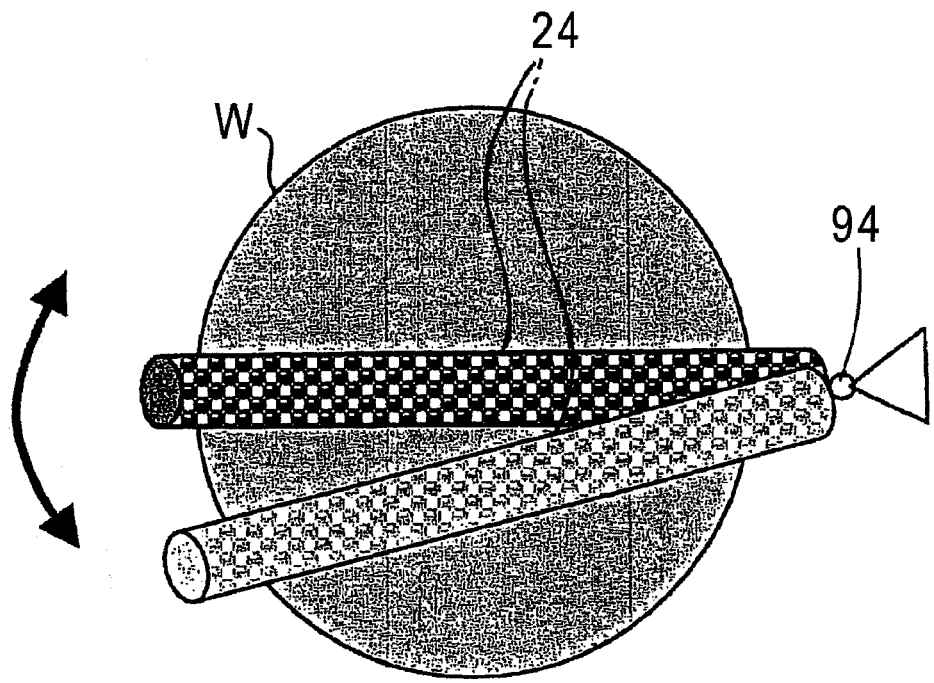
FIG. 23 is a plan view showing another relationship between the upper roll brush and the substrate in the substrate cleaning apparatus according to the present invention.

In each of the above embodiments, the upper roll brush 24 is horizontally moved between parallel positions. However, as shown in FIG. 23, the upper roll brush 24 may have one end swingably supported by a pivot shaft 94, and may be swung in a horizontal plane parallel to the substrate W about the pivot shaft 94. The upper roll brush 24, which is swingable about the pivot shaft 94, offers the same advantages as the upper roll brush 24 that is horizontally moved between parallel positions. For example, if the substrate W comprises a semiconductor wafer having a diameter of 300 mm, then the upper roll brush 24 which is swingable about the pivot shaft 94 through an angle of about 10° offers the same advantages as the upper roll brush 24 whose offset distance $h_1$ (see FIG. 10) is of 20 mm. The upper roll brush 24, which is swingable about the pivot shaft 94, makes the substrate cleaning apparatus simple in structure because it only needs a swinging mechanism on one end of the upper roll brush 24.

Figure 24:
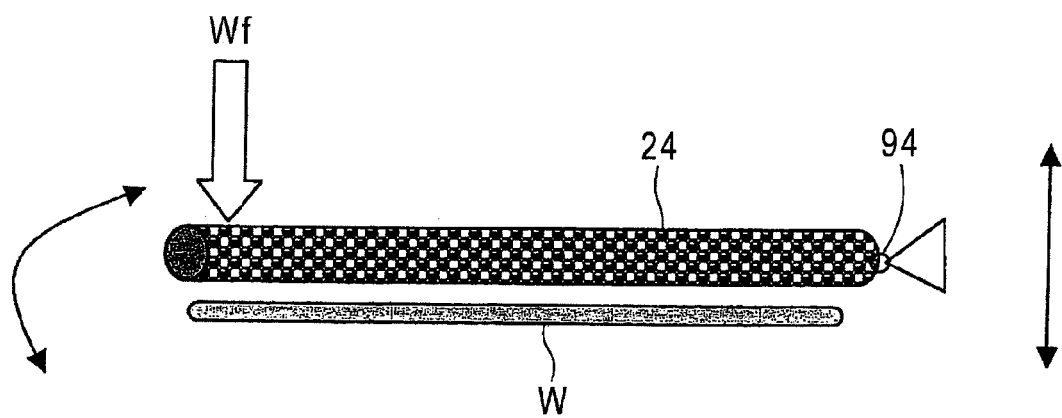
FIG. 24 is a front view showing still another relationship between the upper roll brush and the substrate in the substrate cleaning apparatus according to the present invention.

Furthermore, as shown in FIG. 24, a mechanism for applying a variable load Wf to the free end of the upper roll brush 24 remote from the pivot shaft 94 may be provided. The mechanism can apply a pressing force that is gradient along the longitudinal direction of the upper roll brush 24 such that the pressing force applied to the outer circumferential area of the substrate W is greater than the pressing force applied to the central area of the substrate W to provide more uniform cleaning intensity on the front surface of the substrate W.

Figure 25:
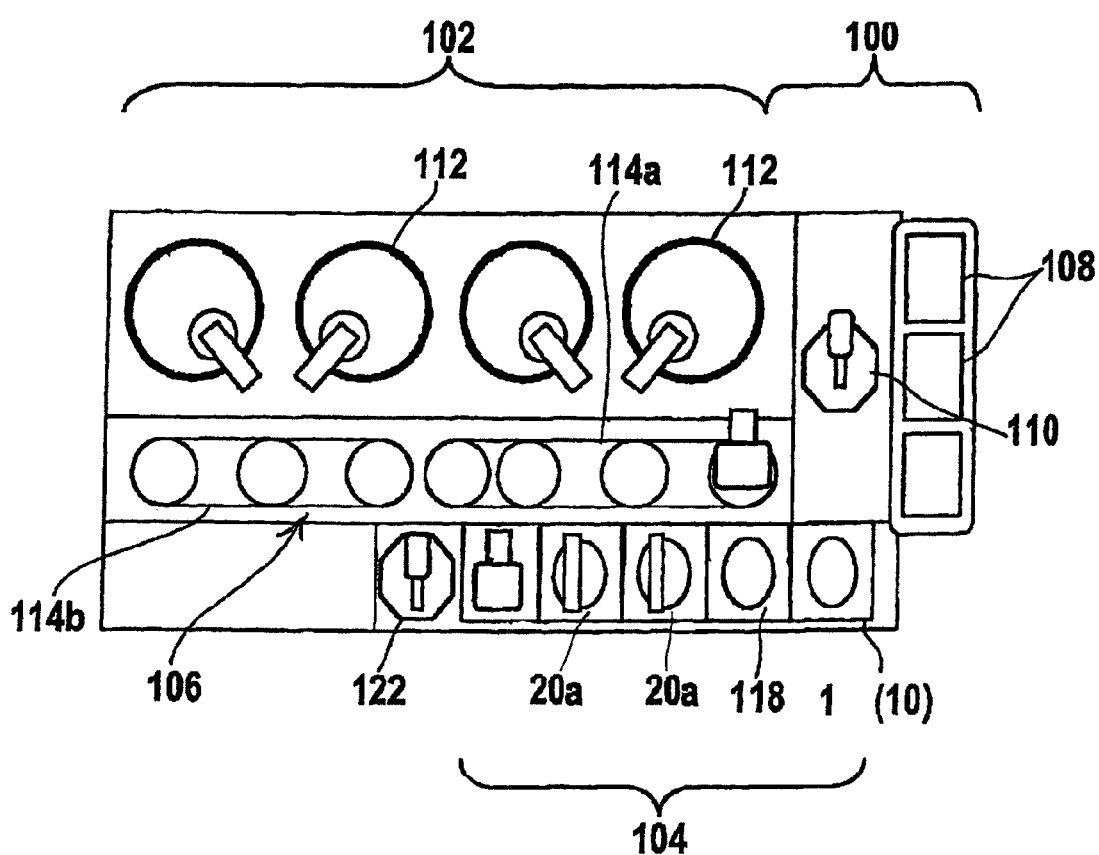
FIG. 25 is a plan view of a polishing apparatus which incorporates the substrate cleaning apparatus according to the present invention.

FIG. 25 shows a polishing apparatus which incorporates the substrate cleaning apparatus 20a according to the embodiment of the present invention. As shown in FIG. 25, this polishing apparatus includes a loading/unloading section 100 for loading and unloading substrates, a polishing section 102 for polishing the surfaces of the substrates to a planar finish, a cleaning section 104 for cleaning the polished substrates, and a substrate transfer section 106 for transferring the substrates. The loading/unloading section 100 comprises a front loader 108 for mounting a plurality of (three in FIG. 25) substrate cassettes storing therein substrates such as semiconductor wafers or the like, and a first transfer robot 110.

In this embodiment, the polishing section 102 comprises four polishing units 112. The substrate transfer section 106 comprises a first linear transporter 114a and a second linear transporter 114b each for transferring substrates between adjacent two of the polishing units 112. The cleaning section 104 comprises two substrate cleaning apparatus 20a according to the embodiment of the present invention for performing a pre-cleaning process on substrates, a finishing cleaner 118 for performing a finishing cleaning process on substrates according to a spin-drying process, and a drying unit 120. A second transfer robot 122 is positioned between the first linear transporter 114a, the second linear transporter 114b, and the cleaning section 104.

In this embodiment, the polishing apparatus shown in FIG. 25 employs the substrate cleaning apparatus 20a shown in FIGS. 6 through 9 for cleaning the polished substrates. However, the substrate cleaning apparatus 20b shown in FIGS. 12 through 14 or the substrate cleaning apparatus 20c shown in FIGS. 21 and 22 may be employed instead of the substrate cleaning apparatus 20a shown in FIGS. 6 through 9.

The polishing apparatus shown in FIG. 25 operates as follows: A substrate is taken from one of the substrate cassettes mounted in the front loader 108 by the first transfer robot 110, and transferred to one of the polishing units 112 of the polishing section 102 by the first linear transporter 114a or the first linear transporter 114a and the second linear transporter 114b. After the substrate is polished by the polishing unit 112, it is transferred to the cleaning section 104 by the second transfer robot 122, and cleaned successively by the substrate cleaning apparatus 20a and the finishing cleaner 118 of the cleaning unit 104. Then, the cleaned substrate is dried by the drying unit 120, and thereafter returned to the substrate cassette mounted in the front loader 108 by the first transfer robot 110.

In each of the above embodiments, each of the roll-shaped cleaning members, i.e., the upper roll brush 24 and the lower roll brush 50, comprises the roll brush 18, as shown in FIG. 3, having the cylindrical nodules 18a on its outer circumferential surface. The nodules 18a should preferably be distributed so as to be progressively denser from the center toward outer ends of the roll brush 18 for enabling the roll brush 18 itself to prevent the cleaning intensity from being intensive in the central area of the substrate W.

In each of the above embodiments, only the upper roll brush 24 is moved parallel to the substrate W. However, the upper roll brush 24 and the upper cleaning liquid supply nozzle 26 may be moved in unison with each other. The upper cleaning liquid supply nozzle 26, which moves in unison with the upper roll brush 24, is capable of supplying the cleaning liquid more uniformly to the front surface of the substrate W.

The substrate cleaning apparatus according to the present invention is not limited to applications in a polishing apparatus, but may also be used as a substrate cleaning apparatus in an electroplating apparatus or an electroless plating apparatus. The roll-shaped cleaning member is not limited to a roll brush with nodules, but may be a roll brush free of nodules. While in the cleaning process, the roll-shaped cleaning member may scrub the surface to be cleaned of the substrate W without rotating about its own central axis.

Although certain preferred embodiments of the present invention have been shown and described in detail, it should be understood that various changes and modifications may be made therein without departing from the scope of the appended claims.

What is claimed is:

1. An apparatus for cleaning a rotating substrate, said apparatus comprising:
 a roll-shaped cleaning member for performing a scrubbing process on a surface to be cleaned of the rotating substrate while holding an outer circumferential surface of the roll-shaped cleaning member in contact with the surface to be cleaned of the rotating substrate across a predetermined contact width;
 a moving mechanism for moving the roll-shaped cleaning member parallel to the surface to be cleaned of the rotating substrate in a direction perpendicular to a central axis of the roll-shaped cleaning member;

a stopper for stopping movement of the roll-shaped cleaning member at an offset cleaning position at which the roll-shaped cleaning member performs the scrubbing process, the offset cleaning position being a position at which the central axis of the roll-shaped cleaning member is horizontally spaced from the central axis of the rotating substrate by a distance which is 0.14 to 0.5 times the contact width; and a stop position adjuster for positionally adjusting the stopper.

2. An apparatus according to claim 1, wherein the outer circumferential surface of the roll-shaped cleaning member has a plurality of nodules for contacting the surface to be cleaned of the rotating substrate, the nodules being distributed so as to be progressively denser from a center toward outer ends of the roll-shaped cleaning member.

3. An apparatus according to claim 1, wherein the moving mechanism is configured to move the roll-shaped cleaning member parallel to the surface to be cleaned of the rotating substrate to the offset cleaning position so as to clean a central area of the substrate.

4. An apparatus according to claim 1, wherein the moving mechanism is configured to move the roll-shaped cleaning member parallel to the surface to be cleaned of the rotating substrate to the offset cleaning position so as to uniformly clean the surface of the substrate.

5. An apparatus according to claim 1, further comprising a lifting cylinder configured to elevate the roll-shaped cleaning member away from the surface of the substrate when the moving mechanism is moving the roll-shaped cleaning member parallel to the surface to be cleaned of the rotating substrate, and to lower the roll-shaped cleaning member into contact with the surface to be cleaned of the rotating substrate.

6. An apparatus for cleaning a rotating substrate, said apparatus comprising:

a roll-shaped cleaning member for performing a scrubbing process on a surface to be cleaned of the rotating substrate while holding an outer circumferential surface of the roll-shaped cleaning member in contact with the surface to be cleaned of the rotating substrate across a predetermined contact width; and a reciprocally moving mechanism for reciprocating the roll-shaped cleaning member between a central cleaning position, where the central axis of the roll-shaped cleaning member and the central axis of the rotating substrate cross each other, and at least one offset cleaning position, where the central axis of the roll-shaped cleaning member is horizontally spaced from the central axis of the rotating substrate, the reciprocally moving mechanism being configured to reciprocate the roll-shaped cleaning member in directions perpendicular to a central axis of the roll-shaped cleaning member while keeping the roll-shaped cleaning member in contact with the surface of the rotating substrate, and to control the roll-shaped cleaning member to dwell in the central cleaning position and the offset cleaning position during respective predetermined times;

wherein the reciprocally moving mechanism includes a positionally adjustable stopper for positioning and stopping the roll-shaped cleaning member in each of the central cleaning position and the offset cleaning position.

7. An apparatus according to claim 6, wherein the outer circumferential surface of the roll-shaped cleaning member has a plurality of nodules for contacting the surface to be cleaned of the rotating substrate, the nodules being distributed so as to be progressively denser from a center toward outer ends of the roll-shaped cleaning member.

8. An apparatus for cleaning a rotating substrate, said apparatus comprising:

a roll-shaped cleaning member for performing a scrubbing process on a surface to be cleaned of the rotating substrate while holding an outer circumferential surface of the roll-shaped cleaning member in contact with the surface to be cleaned of the rotating substrate across a predetermined contact width; and a reciprocally moving mechanism for reciprocating the roll-shaped cleaning member between a central cleaning position, where the central axis of the roll-shaped cleaning member and the central axis of the rotating substrate cross each other, and at least one offset cleaning position, where the central axis of the roll-shaped cleaning member is horizontally spaced from the central axis of the rotating substrate, the reciprocally moving mechanism being configured to reciprocate the roll-shaped cleaning member in directions perpendicular to a central axis of the roll-shaped cleaning member while keeping the roll-shaped cleaning member in contact with the surface of the rotating substrate, and to control the roll-shaped cleaning member to dwell in the central cleaning position and the offset cleaning position during respective predetermined times;

wherein the offset cleaning position is one of a plurality of offset cleaning positions, and the time during which the roll-shaped cleaning member dwells in each of the offset cleaning positions is proportional to the distance between each of the offset cleaning positions and the central axis of the rotating substrate.

9. An apparatus according to claim 8, wherein the outer circumferential surface of the roll-shaped cleaning member has a plurality of nodules for contacting the surface to be cleaned of the rotating substrate, the nodules being distributed so as to be progressively denser from a center toward outer ends of the roll-shaped cleaning member.

* * * * *